United States Patent
Thompson et al.

(10) Patent No.: US 12,241,917 B2
(45) Date of Patent: Mar. 4, 2025

(54) ENERGY DETECTION WARNING DEVICE

(71) Applicant: Safeguard Equipment, Inc., Post Falls, ID (US)

(72) Inventors: John Wayne Thompson, Coeur d' Alene, ID (US); Timothy Ledford, Coeur d'Alene, ID (US); Brandon Bledsoe, Coeur d'Alene, ID (US)

(73) Assignee: Safeguard Equipment, Inc., Post Falls, ID (US)

( * ) Notice: Subject to any disclaimer, the term of this patent is extended or adjusted under 35 U.S.C. 154(b) by 0 days.

(21) Appl. No.: 17/746,682

(22) Filed: May 17, 2022

(65) Prior Publication Data

US 2022/0276288 A1 Sep. 1, 2022

Related U.S. Application Data

(60) Continuation of application No. 17/322,343, filed on May 17, 2021, now Pat. No. 11,579,174, which is a
(Continued)

(51) Int. Cl.
*G01R 19/155* (2006.01)
*G01R 15/16* (2006.01)
(Continued)

(52) U.S. Cl.
CPC ............ *G01R 19/155* (2013.01); *G01R 15/16* (2013.01); *G01R 15/18* (2013.01); *G01R 29/085* (2013.01);
(Continued)

(58) Field of Classification Search
None
See application file for complete search history.

(56) References Cited

U.S. PATENT DOCUMENTS

| 4,255,710 A | 3/1981 | Weber |
| 4,295,095 A | 10/1981 | Thomas et al. |

(Continued)

FOREIGN PATENT DOCUMENTS

| CA | 2846703 A1 | 9/2015 |
| CN | 104062488 | 9/2014 |

(Continued)

OTHER PUBLICATIONS

Pan Chao; Portable wave detector low frequency receiving voltage sensitivity performance measurer; Date Published Jun. 25, 2003; Chinese Acad Inst Acoustics [CN]; (Year: 2003).*

(Continued)

*Primary Examiner* — Nasima Monsur
(74) *Attorney, Agent, or Firm* — Lee & Hayes, P.C.

(57) ABSTRACT

A device includes a housing, one or more sensors configured to detect at least one of a voltage or a current in proximity to the device, one or more lighting elements configured to output light responsive to the one or more sensors detecting the at least one of the voltage or the current in proximity to the device, one or more speakers configured to output audio responsive to the one or more sensors detecting the at least one of the voltage or the current in proximity to the device, one or more network interfaces configured to communicatively couple the device to one or more additional devices, and one or more fastening mechanisms configured to secure the device to a surface.

20 Claims, 18 Drawing Sheets

Related U.S. Application Data division of application No. 15/809,958, filed on Nov. 10, 2017, now Pat. No. 11,009,532.

(60) Provisional application No. 62/534,922, filed on Jul. 20, 2017, provisional application No. 62/432,817, filed on Dec. 12, 2016.

(51) Int. Cl.

| | | |
|---|---|---|
| *G01R 15/18* | (2006.01) | |
| *G01R 19/15* | (2006.01) | |
| *G01R 29/08* | (2006.01) | |
| *G08B 7/06* | (2006.01) | |
| *G08B 21/02* | (2006.01) | |
| *G08B 21/18* | (2006.01) | |

(52) U.S. Cl.
CPC ............... *G08B 7/06* (2013.01); *G08B 21/02* (2013.01); *G08B 21/182* (2013.01); *G01R 19/15* (2013.01); *G01R 29/0857* (2013.01)

(56) References Cited

U.S. PATENT DOCUMENTS

| | | | |
|---|---|---|---|
| 5,144,227 A | 9/1992 | Shaw | |
| 5,281,947 A | 1/1994 | Durley et al. | |
| 5,543,777 A | 8/1996 | Vane | |
| 6,329,924 B1 | 12/2001 | McNulty | |
| 6,788,215 B1 | 9/2004 | White | |
| 6,998,832 B1 | 2/2006 | McNulty | |
| 7,339,379 B2 | 3/2008 | Thompson et al. | |
| 8,193,802 B2 | 6/2012 | Jones et al. | |
| 8,710,979 B2 | 4/2014 | Frederick | |
| 8,786,447 B1* | 7/2014 | Wise | G01R 19/155 340/662 |
| 9,280,885 B2 | 3/2016 | Frederick | |
| 9,494,623 B2 | 11/2016 | McNulty | |
| 9,494,632 B1 | 11/2016 | McNulty | |
| 9,501,930 B2 | 11/2016 | Smith et al. | |
| 10,650,655 B2 | 5/2020 | Royal et al. | |
| 2007/0188321 A1* | 8/2007 | Stenlund | G08B 21/02 340/524 |
| 2008/0246481 A1 | 10/2008 | Brune et al. | |
| 2009/0171381 A1 | 7/2009 | Schmitz et al. | |
| 2009/0322512 A1* | 12/2009 | Frederick | G08B 7/06 340/539.11 |
| 2012/0089359 A1* | 4/2012 | Bishop | G01D 18/00 702/107 |
| 2013/0030732 A1 | 1/2013 | Shetty et al. | |
| 2013/0060480 A1 | 3/2013 | Korhonen et al. | |
| 2013/0278278 A1 | 10/2013 | Chapman | |
| 2015/0091735 A1 | 4/2015 | McNulty | |
| 2015/0097680 A1* | 4/2015 | Fadell | H04L 12/2818 340/628 |
| 2016/0232779 A1* | 8/2016 | Sloo | H04L 12/282 |
| 2017/0099888 A1 | 4/2017 | Flynn | |
| 2018/0164350 A1 | 6/2018 | Thompson et al. | |
| 2018/0293891 A1* | 10/2018 | Troutman | G08G 1/13 |
| 2021/0270873 A1 | 9/2021 | Thompson et al. | |
| 2023/0341443 A1 | 10/2023 | Thompson | |

FOREIGN PATENT DOCUMENTS

| | | |
|---|---|---|
| CN | 204245263 | 4/2015 |
| CN | 205567953 | 9/2016 |
| EP | 1296150 | 3/2003 |
| EP | 3312620 | 4/2018 |
| JP | H07134183 A | 5/1995 |
| JP | 2000113349 A | 4/2000 |
| JP | 2005351710 A | 12/2005 |
| JP | 2006105640 A | 4/2006 |
| JP | 2010052860 A | 3/2010 |
| JP | 2011192033 A | 9/2011 |
| JP | WO2013069050 A1 | 4/2015 |
| WO | WO2013069050 A1 | 4/2015 |
| WO | WO2015051039 | 4/2015 |

OTHER PUBLICATIONS

Korean Office Action mailed Oct. 1, 2022 for Korean Patent Application No. 10-2019-7020239, a foreign counterpart to U.S. Pat. No. 11,009,532, 25 pages.

Lal, et al., "Self-powered Sensors with Radioisotope Source", CN 101548401 A, G 01 T 3/06, 2009, 11 pgs.

Mingzhu, et al., "Special, high-voltage line type early warning device for safety helmet", CN 104062488 A, State Gripd Shanghai Municipal Electric Power Co; 2014, 12 pgs.

Office Action for U.S. Appl. No. 17/322,343, mailed on Jun. 9, 2022, Thompson, "Energy Detection Warning Device", 14 pages.

Tomita, et al. "High Voltage Detector", Nat Inst of Occupation Safety & Health Japan, Kasuga Electric Co, JP 2011192033 A; Sep. 29, 2011, 18 pgs.

The Chinese Office Action mailed on Nov. 4, 2020 for Chinese Patent Application No. 201780076658.2, a counter part of U.S. Appl. No. 15/809,958, 15 pages.

The Extended European Search Report mailed on Jan. 31, 2020 for European Patent Application No. 17880148.6, 9 pages.

The Extended European Search Report mailed Jul. 26, 2021 for European Patent Application No. 21170675.9, a foreign counterpart to U.S. Pat. No. 11,009,532, 9 pages.

Indian Office Action mailed Sep. 22, 2021 for Indian Application No. 201917007983, a foreign counterpart to U.S. Pat. No. 11,009,532, 6 pages.

Japanese Office Action mailed Dec. 21, 2021 for Japanese Patent Application No. 2019-551492, a foreign counterpart to U.S. Pat. No. 11,009,532, 12 pages.

Final Office Action dated Oct. 15, 2020 for U.S. Appl. No. 15/809,958, "Energy Detection Warning Device", Thompson, 17 pages.

Non Final Office Action dated Oct. 30, 2019 for U.S. Appl. No. 15/809,958 "Energy Detection Warning Device", Thompson, 23 pages.

The PCT Search Report and Written Opinion mailed on Mar. 22, 2018, for PCT Application No. PCT/US17/61196, 10 pages.

The Korean Office Action mailed Apr. 5, 2023 for Korean Patent Application No. 10-2019-7020239, a foreign counterpart to U.S. Pat. No. 11,009,532, 8 pages.

Indian Hearing Letter mailed Aug. 21, 2023 for Indian Patent Application No. 201917007983, a foreign counterpart to U.S. Pat. No. 11,009,532, 4 pages.

Office Action for U.S. Appl. No. 18/216,413, mailed on Feb. 15, 2024, Thompson, "Energy Detection Warning Device", 34 Pages.

Office Action for U.S. Appl. No. 18/216,413, mailed on Sep. 29, 2024, Thompson, "Energy Detection Warning Device", 35 Pages.

* cited by examiner

Top View

Bottom View

Side View

ENERGY DETECTION WARNING DEVICE

CROSS REFERENCE TO RELATED PATENT APPLICATIONS

This application is a continuation of and claims priority to U.S. patent application Ser. No. 17/322,343, filed May 17, 2021, which is a divisional of and claims priority to U.S. patent application Ser. No. 15/809,958, filed Nov. 10, 2017, now U.S. Pat. No. 11,009,532, issued May 18, 2021, which claims priority to U.S. Provisional Patent Application No. 62/534,922, filed Jul. 20, 2017, entitled "Energy Detection Warning Device," and which claims priority to U.S. Provisional Patent Application No. 62/432,817, filed Dec. 12, 2016, entitled "Energy Detection Device;" which applications are hereby incorporated in their entireties by reference.

BACKGROUND

Technical Field

This disclosure relates to a device that provides a safety warning notification (alert, alarm, warning, etc.) to a user of the device when the user approaches an energized conductor. Further, the device described herein may provide a notification indicating an approximate direction to the energized conductor relative to an orientation of the device with the user.

Description of the Related Art

Since the discovery of the ability to harness and manipulate electrical energy, electrical power has been in high-demand worldwide. In some cases, energy industry workers are setting up new power systems to provide power to places not yet connected. In other cases, workers are updating or enhancing established systems, or repairing and/or rebuilding power systems damaged by natural causes and/or accidental events. Yet, still in other cases, workers may be tasked with removing a power system from an area where power is no longer needed or desired. Regardless of the task, energy workers are constantly engaging in activities surrounding power systems that have inherent dangers via which the workers could be harmed.

Despite the safety regulations and practices designed to prevent accidents in the energy industry, individuals are still injured and killed. In a recent year, the annual death toll for electricity related deaths was still above 130 in the U.S. alone. Thus, additional safety measures are needed.

Conventional devices that provide a personal warning of a high voltage risk are often bulky, analog devices. Some conventional devices may be worn around a worker's neck, or clipped to a front pocket, hat, or belt of the user, but can be cumbersome due to the size. In one instance, a conventional device is built directly into the worker's hat. The conventional devices generally produce simple warnings based only on the detection of the presence of one of a nearby electric or magnetic field, often only once a particular field strength threshold is detected. In some cases, the conventional devices are overly-sensitive and lead to unnecessary warnings.

Accordingly, conventional devices have several problems and limitations.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items. Furthermore, the drawings may be considered as providing an approximate depiction of the relative sizes of the individual components within individual figures. However, the drawings are not to scale, and the relative sizes of the individual components, both within individual figures and between the different figures, may vary from what is depicted. In particular, some of the figures may depict components as a certain size or shape, while other figures may depict the same components on a larger scale or differently shaped for the sake of clarity.

DETAILED DESCRIPTION

Overview

Figure 1:
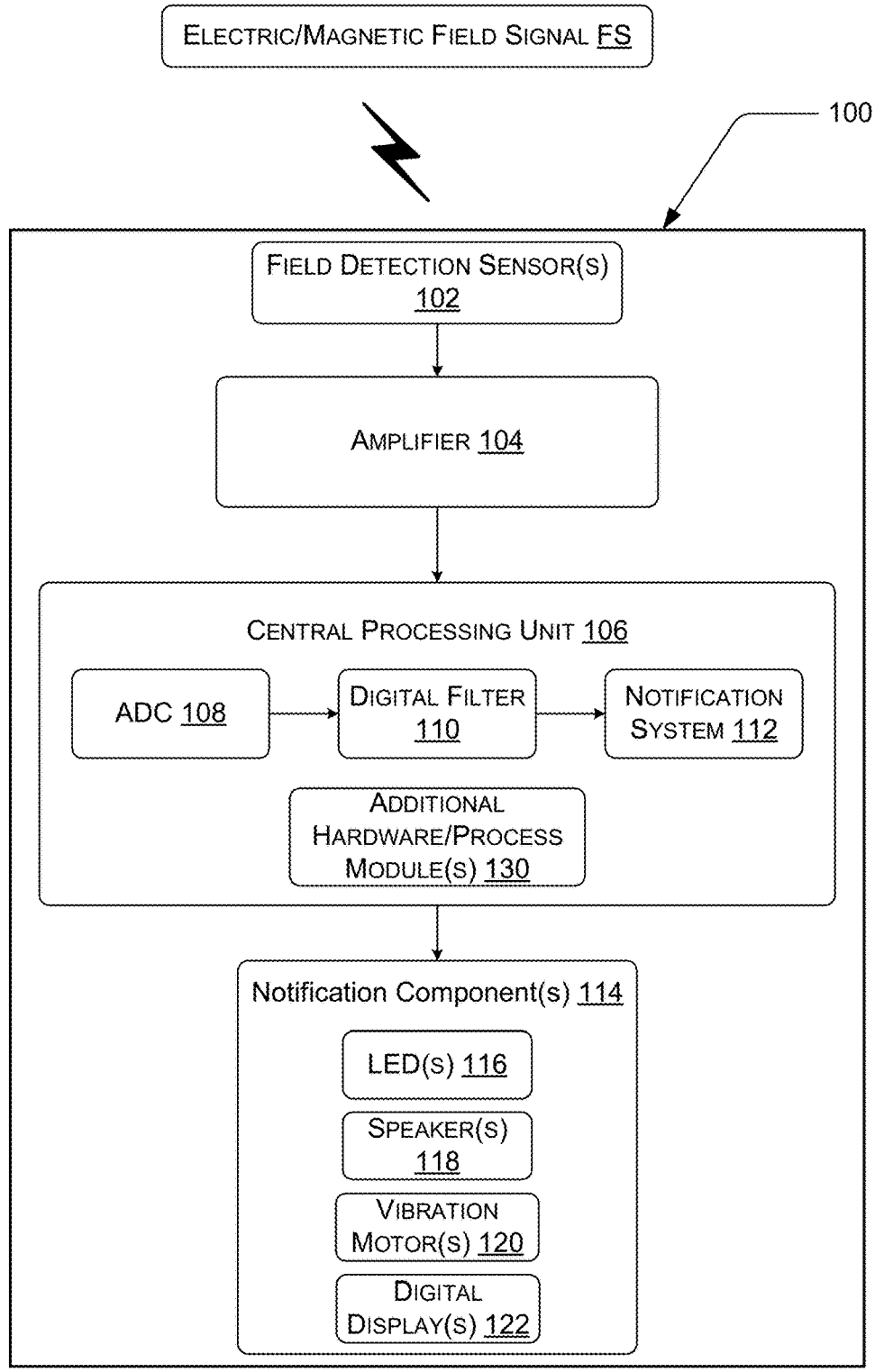
FIG. 1 illustrates a schematic view of the interaction between a field signal and an energy detection warning device according to an embodiment of the instant disclosure.

The following disclosure describes various features and concepts for implementation in an energy detection warning device. That is, while the disclosure describes "an" or "the" energy detection warning device, the article (e.g., "a," "an," or "the") used preceding "energy detection warning device" is not intended to indicate a limitation of the features of the device itself, unless otherwise so stated. Indeed, multiple embodiments of an energy detection warning device may be possible by using one or more of the various features and concepts in varying implementations and/or combinations. For example, while the figures may depict an embodiment of a wearable energy detection warning device, it is contemplated that one or more features and concepts described herein as related to the wearable device may be implemented in other non-wearable embodiments, such as, for example, an embodiment of the features built in to a vehicle configured to alert occupants of a vehicle of potential risks.

Additionally, it is noted that throughout the disclosure, the terms "device," "warning device," "energy detection device," "wearable device," and "energy detection warning device" may be used interchangeably to refer to one or more varying embodiments of the aforementioned "energy detection warning device."

An energy detection warning device as disclosed herein may have a primary function of detecting nearby energized conductors and alerting users to the presence thereof via one or more sensory notifications. Such notifications are issued with the intent to reduce the occurrence of injuries due to electrocution. This goal may be realized when the warning device is used in an environment where the location of an energized conductor may be unknown. Thus, a wearable embodiment of the device may greatly benefit utility linemen, electricians, disaster relief personnel, etc. Further, the device may be sufficiently compact to be worn in a variety of places without inconveniencing the user or causing uncomfortableness.

In an embodiment, a wearable energy detection warning device may be clipped onto the brim of a hat, which may provide advantages in detection and location indication due to relative stability in orientation. While this embodiment that clips to a hat may be worn elsewhere on a user's clothes or body via the same or similar clipping action, it is contemplated that the energy detection warning device may be structured in other configurations (different than shown) with different connection means (not shown), which may be more compatible with securing in places to a user's clothes or body (not shown) other than the brim of a hat. In such alternative embodiments, it is contemplated that features and processes executed by the energy detection warning device may be the same or similar to those described herein. Moreover, it is also understood that in such alternative structural configurations, that the processes described herein may be modified compared to those described herein below to compensate for the change in structure and/or difference in relative positioning, etc. Thus, an energy detection warning device may be formed in other structural embodiments including, but not limited to, a structure configured to be worn on a user's wrist (not shown). It further follows that the arrangement and orientation of internal components in a wrist-worn embodiment may be altered from the description herein to adjust for differences that may exist in the manner of detection according to common movements of a user's wrist, as compared to movements of a user's head on which a hat bearing a warning device sits.

Regardless of structural configuration, in an embodiment, the location of an energized conductor may be detected by converting an analog signal into a digital signal, and a safety notification may be initiated to alert a user to the presence and location of a hazardous energized conductor. Even if the precise distance between an energized conductor and the device is not easily determined, the detection device provides a user with a "sixth sense" of the existence of potentially harmful energized conductor within a particular proximity around the user. Thus, the energy detection warning device may enhance safety in a work environment and assist a worker when working around high-voltage equipment.

The energy detection warning device may use any combination of visual, auditory, or tactile notifications to alert the user when approaching and/or entering a particular proximity of an energized conductor. The warning notifications may be initiated via a signal issued by a microcontroller (also referred to herein as the central processing unit "CPU," which includes several hardware and/or software components described further herein below). On a high level, the warning device may implement sensors (e.g., one or more antenna components) that are configured to detect/sense an energized conductor with a given proximity thereof. In an embodiment, the particular proximity, which a warning notification may be initiated, may be defined, for example, as a distance of about six times the Occupational Safety & Health Administration ("OSHA") standard Minimum Approach Distance ("MAD") between a user and an energized conductor. The MAD varies with respect to the voltage of the detected field. The distance of the particular proximity around the energized conductor may vary, ranging from 10 times the MAD to less than 6 times the MAD. Although the warning device may be programmed to be triggered at distances less than the MAD standards set by OSHA, such an embodiment may be considered unsafe and therefore, not practical.

It is noted that many, if not all, energized conductors may be dangerous depending on the circumstances. However, the risk of harm increases as the potential energy to be released increases (i.e., higher voltage relates to greater potential for serious physical harm); and as the amount of electrical energy in the proximity increases, the magnitude of the field signal to be detected likewise increases, thereby enabling the device to detect high voltage carrying conductors at greater distances. Regardless, the energy detection warning device may be configured to detect electric or magnetic fields having at least a minimum predetermined magnitude to thereby indicate that a greater risk of harm is possible. In an example, as a user wearing a wearable energy detection warning device approaches a standard, properly-functioning electrical wall outlet, where the risk of harm is low for a worker, the device is not likely to initiate a warning unless the device is placed at the height level of and within a few inches of the outlet. In contrast, in an embodiment of an energy detection warning device configured to issue a warning notification within six times the MAD, as a user wearing the energy detection warning device approaches a live wire carrying 1.1 KV or greater, the energy detection warning device may initiate a warning when the user comes within approximately 12 feet of the live wire (assuming the MAD is about 24-25 inches), for example.

In the event a user approaches an energized conductor, the knowledge that the conductor exists nearby is helpful. However, without having an idea of where the conductor is, the mere knowledge that the conductor is somewhere close may not be sufficient to adequately protect the user, as the energized conductor may be hidden or unnoticeable until it is too late, and the user could be injured. Accordingly, as described herein, beyond merely detecting the presence of an energized conductor, the energy detection warning device of the instant disclosure may also alert the user of the direction in which the energized conductor is located relative to the orientation of the device along with a risk level of electrocution. As a user is moving in an area, the device may use one or more warning notification components to further indicate the approximate direction of the energized conductor from the device, whether to the left or right of the user, or directly in front of or behind the device, as it is oriented on a user.

Inasmuch as energized conductors may emit an electric field due to the charge on the conductor, and a magnetic field due to current flowing through the conductor, the energy detection warning device described herein may be configured to detect electric fields and/or magnetic fields. Using historical data of one or both of the detected fields, the warning device may approximate the directionality of an energized conductor with respect to the position of the device.

For example, in a wearable embodiment, in which the device is clipped to the front of the user's hat, the device may determine an absolute orientation for the device based, at least in part, on the gravitational vector and the earth's magnetic field vector, similar to how a compass functions to determine magnetic north. Once the absolute orientation is determined, the movement of the user, either by moving the user's entire body (e.g., walking, running, being transported, etc.) or simply rotating or tilting the user's head, may be determined relative to the absolute orientation, and if, during the movement, an electric and/or a magnetic field signal is detected, one or more warning notification components (e.g., auditory, visual, sensory) may be activated to indicate the direction in which the peak of the electric and/or magnetic field is detected.

In an embodiment, upon detection of an energized conductor, an energy detection warning device may actuate one or more LEDs to orient the user to the relative direction of the energized conductor. This may be achieved, for example, by: illuminating a series of LEDs at increasing levels of brightness sequentially disposed across the device in the direction of the energized conductor, such that the brightest LED is located on the side of the device corresponding to the direction of the energized conductor; illuminating one or more LEDs with gradually increasing brightness levels as a group, as the device is oriented toward the direction of the energized conductor; illuminating a series of LEDs, either fully on or intermittently fully on/off, in a sequence across the device in the direction of the energized conductor; illuminating, either fully on or intermittently fully on/off, one or more LEDs disposed on a side of the device corresponding to the relative direction of the energized conductor; or a combination of more than one of the aforementioned examples, etc. Further, as the device moves with the user in the direction indicated, the device may alter the actuation of the one or more LEDs when the device is oriented in substantial alignment with the direction in which the peak of the electric and/or magnetic field is detected. An alteration of the actuation may include, for example actions such as the device may: stop illuminating the series of LEDs sequentially; fully illuminate the one or more LEDs simultaneously; slow the illumination sequence; stop illuminating the one or more LEDs completely; etc.

Additionally, and/or alternatively, upon detection of an energized conductor, an energy detection warning device may actuate one or more vibrational motors to orient the user to the relative direction of the energized conductor. This may be achieved, for example, by: actuating a series of vibrational motors at increasing levels of vibrational intensity sequentially disposed across the device in the direction of the energized conductor, such that the most intensely vibrating motor is located on the side of the device corresponding to the direction of the energized conductor; actuating one or more vibrational motors with gradually increasing intensity levels as a group, as the device is oriented toward the direction of the energized conductor; actuating a series of vibrational motors at a similar intensity, either on or intermittently on/off, in a sequence, sequentially across the device in the direction of the energized conductor; actuating one or more vibrational motors disposed on a side of the device corresponding to the relative direction of the energized conductor; or a combination of more than one of the aforementioned examples, etc. Further, as the device moves with the user in the direction indicated, the device may alter the actuation of the one or more vibrational motors when the device is oriented in substantial alignment with the direction in which the peak of the electric and/or magnetic field is detected. An alteration of the actuation may include, for example actions such as the device may: stop actuating the vibrational motors sequentially; fully activate all vibrational motors simultaneously; slow the vibrational sequence; stop vibration of the vibrational motors completely; etc.

Additionally, and/or alternatively, upon detection of an energized conductor, an energy detection warning device may initiate one or more auditory signals, via a speaker for example, to orient the user to the relative direction of the energized conductor. This may be achieved by emitting a sound or language, for example, by: actuating a series of speakers at increasing levels of volume sequentially disposed across the device in the direction of the energized conductor, such that the loudest speaker is located on the side of the device corresponding to the direction of the energized conductor; actuating one or more speakers with gradually increasing tonality and/or intensity levels as a group, as the device is oriented toward the direction of the energized conductor, and the tone and/or intensity may be highest when the user is looking directly at the direction of the energized conductor (as associated with the highest measured energy field value); actuating a series of speakers at a similar intensity, either on or intermittently on/off, in a sequence, sequentially across the device in the direction of the energized conductor; actuating one or more speakers disposed on a side of the device corresponding to the relative direction of the energized conductor; actuating a speaker to state the direction verbally (e.g., right, left, ahead, behind, etc.); sending a sound or verbal direction to headphones on a user (not shown) in one or both sides; or a combination of more than one of the aforementioned examples, etc. Further, as the device moves with the user in the direction indicated, the device may alter the actuation of the one or more speakers when the device is oriented in substantial alignment with the direction in which the peak of the electric and/or magnetic field is detected. An alteration of the actuation may include, for example actions such as the device may: stop actuating the speakers sequentially; fully activate all speakers simultaneously; slow the auditory sequence; stop actuation of the speakers completely, etc.

Additionally, and/or alternatively, upon detection of an energized conductor, an energy detection warning device may actuate one or more digital displays to orient the user to the relative direction of the energized conductor. This may be achieved, for example, by: actuating an LED-illuminated display to depict the words "left," "right," "front," "back," etc., or simply an arrow pointing toward the side of the device corresponding to the direction of the energized conductor; or other visually descriptive display of location; or a combination of more than one of the aforementioned examples, etc. Further, as the device moves with the user in the direction indicated, the device may alter the actuation of the one or more digital displays when the device is oriented in substantial alignment with the direction in which the peak of the electric and/or magnetic field is detected. An alteration of the actuation may include, for example actions such as the device may: stop actuating the digital display, display a different indicative symbol (e.g., a squiggly line, a stop sign, an exclamation point, etc.), illuminate the entire display continuously or flashing, etc.

In an embodiment, the energy detection warning device may implement an adaptive sensitivity detection ("ASD") process. Broadly stated, the device detection sensitivity adapts to the environment to be useful without being excessive so that users do not become annoyed with unnecessary notifications and end up removing the device. As such, the warning device may function sensitively in an electromagnetic field ("EMF") free area, as well as in an EMF intense area (e.g., a power substation). In an embodiment using the ASD process, the device may issue alert notifications based on the historical changes in the detected field(s) from an energized conductor. That is, as a user enters a particular proximity where an electric and/or magnetic field is detectable, the warning device measures a positive change in the detected field. Upon detecting the positive change, the warning device may initiate a warning notification that lasts for a predetermined amount of time, (e.g., about 10 seconds, about 20 seconds, about 30 seconds, etc.). At the end of the predetermined time period, the operating threshold may be adjusted to the detected level of the EMF in the current environment. Thereafter, each time the user gets closer to the energized conductor, an additional positive change in the detected field is measured, and a warning notification is again issued. In an embodiment, the activation threshold for the warning notification intensity may scale with the adjusted operational threshold, so that warning notifications more closely follow the naturally-occurring exponential-curve shape of the measured EMF.

Using ASD, the warning device may detect an energized conductor within a particular proximity of the energized conductor. The device may be further configured such that, after emitting a warning notification for the detection of the energized conductor at that particular proximity for a predetermined time period, the device adapts the warning process to the current detected level of voltage such that no warning notification is issued again to the user while the device remains within the same proximity. In an embodiment, the device using ASD may be further configured such that a subsequent warning notification is not initiated unless: 1) the device warning notification threshold is reset, either automatically or manually by a user (e.g., a user stays within the same proximity of the energized conductor as when the previous warning notification was initiated); 2) the proximity of the device to the energized conductor is decreased (e.g., the user moves closer to the conductor with the device); or 3) the device re-adapts to a lower detected level of voltage before detecting the previously detected level of voltage again (e.g., the user moves away from the conductor with the device and then reenters the particular proximity).

Accordingly, in an embodiment implementing ASD, a user who is working substantially in a static location for a length of time greater than the predetermined time period of the warning notification, (e.g., a lineman who is working at the top of a utility pole in an essentially static position with respect to a live line for an extended time period), need not be subjected to extended or endless warning notifications since the lineman is neither able to leave the particular proximity in which the warning notification was initiated, nor is the lineman getting any closer to the conductor. Additionally, the energy detection warning device may include an actuatable member (e.g., button, switch, etc.) that the user can manually actuate to terminate the warning notification prior to the end of the predetermined time period. The button may additionally, and/or alternatively, be actuated to cause the device to instantly adapt to the new detected voltage level.

As it may be desired to ensure that an energy detection warning device is properly functioning prior to use on a job, a self-test feature may be incorporated in an embodiment of the device. More specifically, the microcontroller may periodically apply small-scale test signals to the sensor(s) (e.g., electric and/or magnetic field sensors), to ensure that the sensor(s) is/are operating correctly. Inasmuch as the sensor(s) may be susceptible to over-exposure after use, the self-test may be applied to determine whether the device should be used.

Additionally, in an embodiment, the warning device may record on memory, built into the warning device, data regarding the use of the warning device. Such data may include, but is not limited to: the identification of the user, the duration of use, the manner of use (e.g., orientation of device during use, quantity of warnings issued, user compliance to warning notifications, etc.), errors encountered, geographic location of the device and location where warning notifications were issued, etc. This data may be collected and organized by the warning device and/or by a receiving device intended to receive the data. The data may be transferred via a wired or wireless transfer to the receiving device. The data may further be analyzed by the receiving device and/or the data may be further transferred to a server for further and/or additional analysis. The data may include information to analyze work-place safety metrics to evaluate the safety practices of workers. Examples of possible receiving devices may include a cell phone, tablet, laptop, desktop computer, or any other electronic device capable of receiving the data. Furthermore, the warning device may be equipped with a hardwire connection and/or wireless data transfer hardware and/or software in order to transfer the data out of the warning device, at which point the memory may be wiped and reset to store additional data. In an embodiment, the warning device may use Bluetooth® technology to transfer the data from the warning device to a receiving device constantly or intermittently.

Illustrative Embodiments of an Energy Detection Warning Device

A schematic view of an embodiment of an energy detection warning device 100 is shown in FIG. 1. Device 100 may include one or more field detection sensors 102 configured to detect a field signal FS that is at least one of an electric field signal or a magnetic field signal. Upon detection of a field signal FS by the one or more field detection sensors 102, the detected signal may be passed to an amplifier 104, which is configured to amplify the detected signal. The amplified signal may then pass to a CPU 106 (e.g., microcontroller). CPU 106 may process the amplified signal via an analog-to-digital converter 108 ("ADC"). The converted digital signal may then be further processed via a digital filter 110. Once filtered, the CPU 106 determines whether to issue a warning notification via notification system 112 which may compare the signal to a predetermined threshold signal, as well as processing the signal with the historical measurements of the signal (described further herein). Additional hardware and or process modules 130 such as memory, may be implemented to assist the functions of CPU 106.

Upon a determination that a warning notification should be initiated, CPU 106 may execute an operation to cause one or more notification components 114 to begin a warning notification, as discussed in detail above. For example, one or more of notification components 114 may include, but are not limited to: one or more LEDs 116, one or more speakers 118, one or more vibration motors 120, or one or more digital displays 122.

In an embodiment, the one or more field detection sensors 102 may include capacitively-couple antennas to detect field signal FS and determine directionality of where field signal FS originates. Conduction may be used to sense the presence of an energized conductor through a high-voltage insulator. In general, no material is a perfect insulator, and thus, at least a small amount of current conducts through the insulator. This "small" amount may be measured and detected by an energy detection warning device 100, according to an embodiment described herein.

Figure 2:
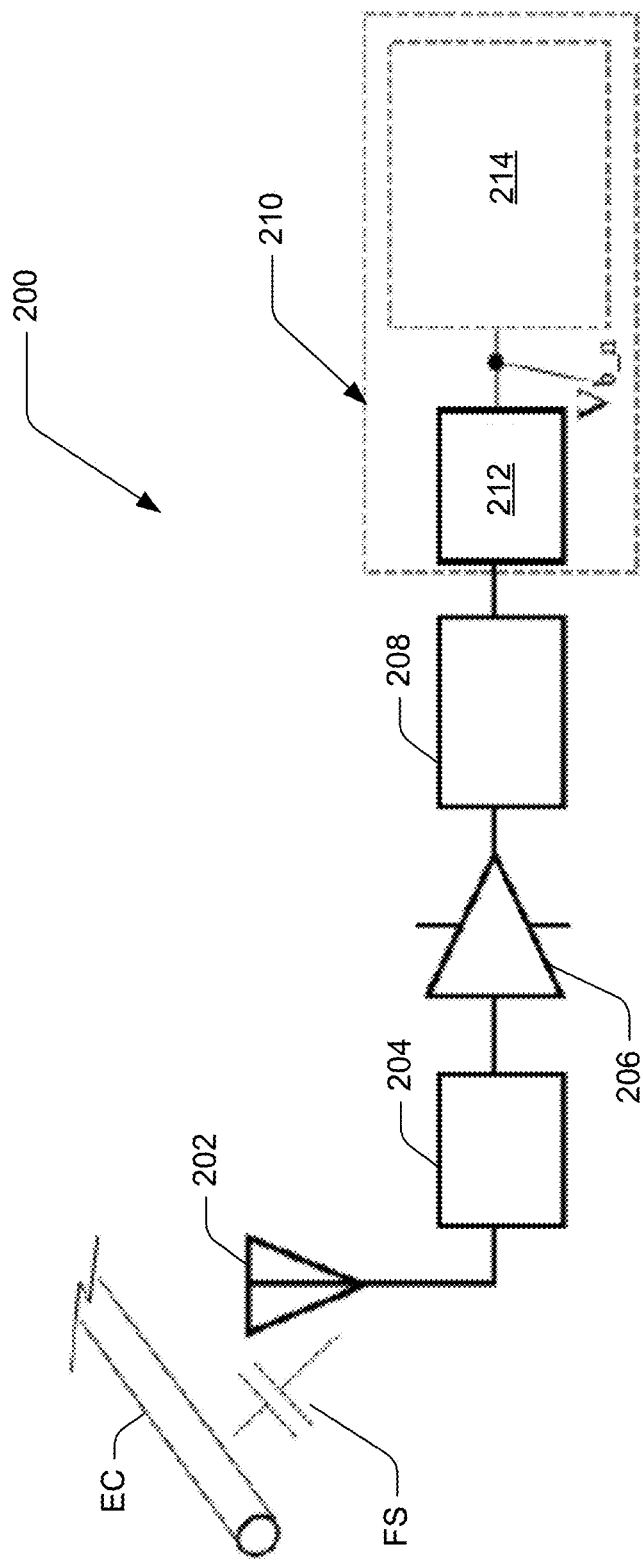
FIG. 2 illustrates an electrical schematic of an embodiment of an energy detection warning device.

In FIG. 2, greater details of an embodiment of an energy detection warning device 200 are depicted in an electrical schematic. A field detection sensor 202 is configured to measure the field signal FS from an energized conductor EC. For example, the field detection sensor 202 may include at least one of: one or more capacitively coupled antennas to measure the electric field, one or more inductively coupled antennas to measure the magnetic field, or a magnetometer. Antennas and/or a magnetometer are provided to assist in determining the direction of the field signal FS with respect to the device. Thus, in the presence of field signal FS, a variation of charge on the energized conductor EC induces "coupled" variation (with opposite charge) on the field detection sensor 202, such as a capacitive antenna.

Thereafter, the measured field signal FS may then be passed through a low pass filter 204 to extract a 60 Hz term, which is directly correlated to a power-system's frequency. Further, for detecting smaller signals, the signal may be amplified by an amplifier 206, which improves signal quality and increases signal magnitude. Signal conditioning may be performed by a DC offset module 208 to make the signal compatible with a microcontroller 210.

Microcontroller 210 may implement an analog-to-digital-converter 212 to turn the measured signal, which is an analog value, into a digital value that is further processed using software algorithms and/or additional hardware, collectively depicted as box 214.

Figure 3:
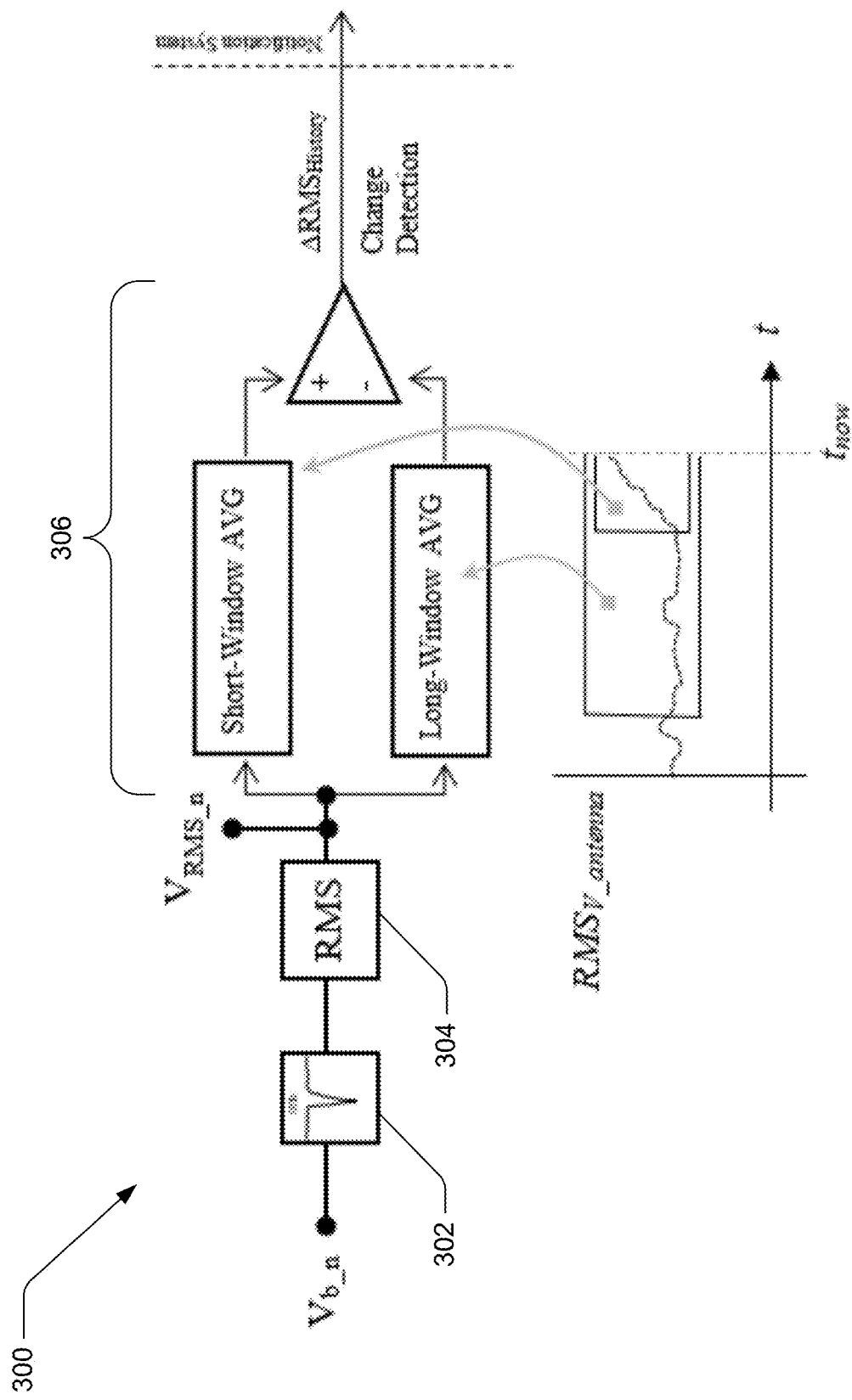
FIG. 3 illustrates an electrical schematic of an embodiment of a signal process flow in an energy detection warning device.

Upon receipt of a converted digital signal, microcontroller 210 further processes the signal to activate the notification system. FIG. 3 depicts an embodiment of a schematic 300 showing elements of a microcontroller to further refine the signal, for example, and fulfill one or more functions of the software algorithms and/or additional hardware depicted as box 214 in FIG. 2.

With respect to the converted digital signal, as seen in FIG. 3, a filter 302 may be applied to yield only the coupled 60 Hz signal from the power system. In an embodiment, filter 302 may include a DC notch filter and a low-pass filter. Following filter 302, the root-mean-squared (RMS) value of the signal (also known as the DC equivalent) may be calculated in RMS module 304. The filtered, RMS value may then pass to a sensory adaptation and change detection logic module 306. At module 306, the history of the detected values may be analyzed with respect to a Short-Window AVG (SWA) and a Long-Window AVG (LWA), where "AVG" represents the average detected field signal within a previous time period. As represented in the inset graph (Time (t) v. $RMS_{V\_antenna}$) in FIG. 3, the average signal detected of the SWA is determined using the average detected field signal for a first predetermined time period looking backwards from the instant time during the time of use of the device. Further, the average signal detected of the LWA is determined using the average detected field signal for a second predetermined time period looking backwards from the instant time. The second predetermined time period is longer than the first predetermined time period and overlaps the first predetermined time period. After the SWA and LWA are calculated, the difference therebetween is outputted for further evaluation with respect to a notification. That is, the difference (i.e., $\Delta RMS_{History}$) between SWA and LWA may be calculated to detect a change in the normal measured signal in an environment where the device is being used, and, based at least in part on a detected change, the energy detection warning device may initiate a warning notification.

As mentioned above, an embodiment of the energy detection warning device may include an adaptive sensitivity detection ("ASD") process feature. In the event that the distance between the device and the energized conductor remain substantially the same for a given amount of time, and/or in the event that the measured signal remains constant, the output of module 306 normalizes (i.e., the change between SWA and LWA approaches zero). When the output of module 306 normalizes, the energy detection warning device adapts to the new environment, and a new warning notification will not be initiated so long as the output of module 306 remains substantially constant. However, if there is a sudden change in the signal, the output of module 306 will be non-zero, and a new notification warning may be initiated.

Figure 4:
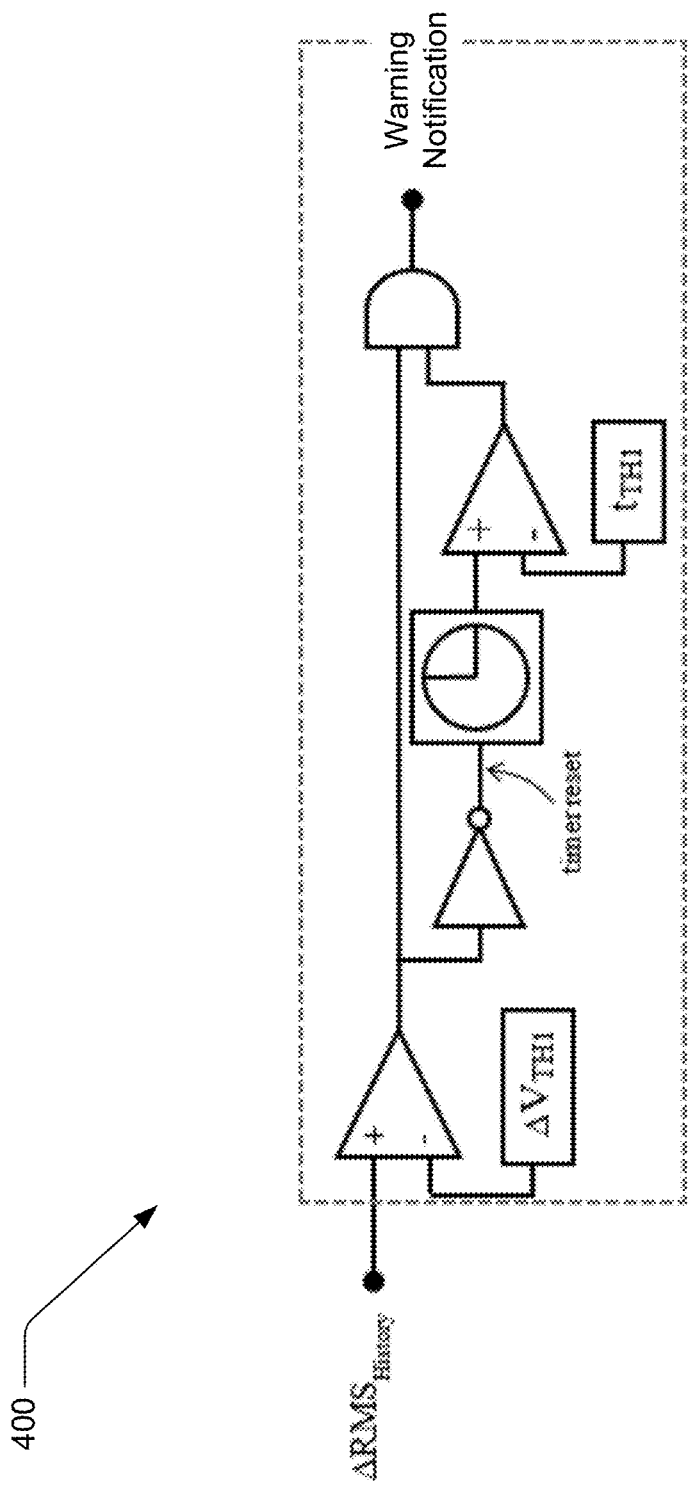
FIG. 4 illustrates an electrical schematic of an embodiment of a signal process flow that may occur within the microcontroller of an energy detection warning device.

FIG. 4 depicts a schematic 400 of the signal process flow that may occur within the microcontroller of the device for determining whether to initiate a warning notification. In an embodiment, a warning notification may be initiated when the $\Delta RMS_{History}$ value exceeds a predetermined threshold $\Delta V_{TH1}$ for a predetermined amount of time trill. In some instances, the signal process flow of FIG. 4 may improve the reliability of the device and may also reduce unnecessary warning notifications. Note, the $\Delta RMS_{History}$ used as input in FIG. 4 was previously determined and output as described with respect to FIG. 3. Additionally, when the $\Delta RMS_{History}$ value is less than the threshold $\Delta V_{TH1}$ or less than the threshold $\Delta V_{TH1}$ for the predetermined amount of time $t_{TH1}$, the timer is reset.

Figure 5:
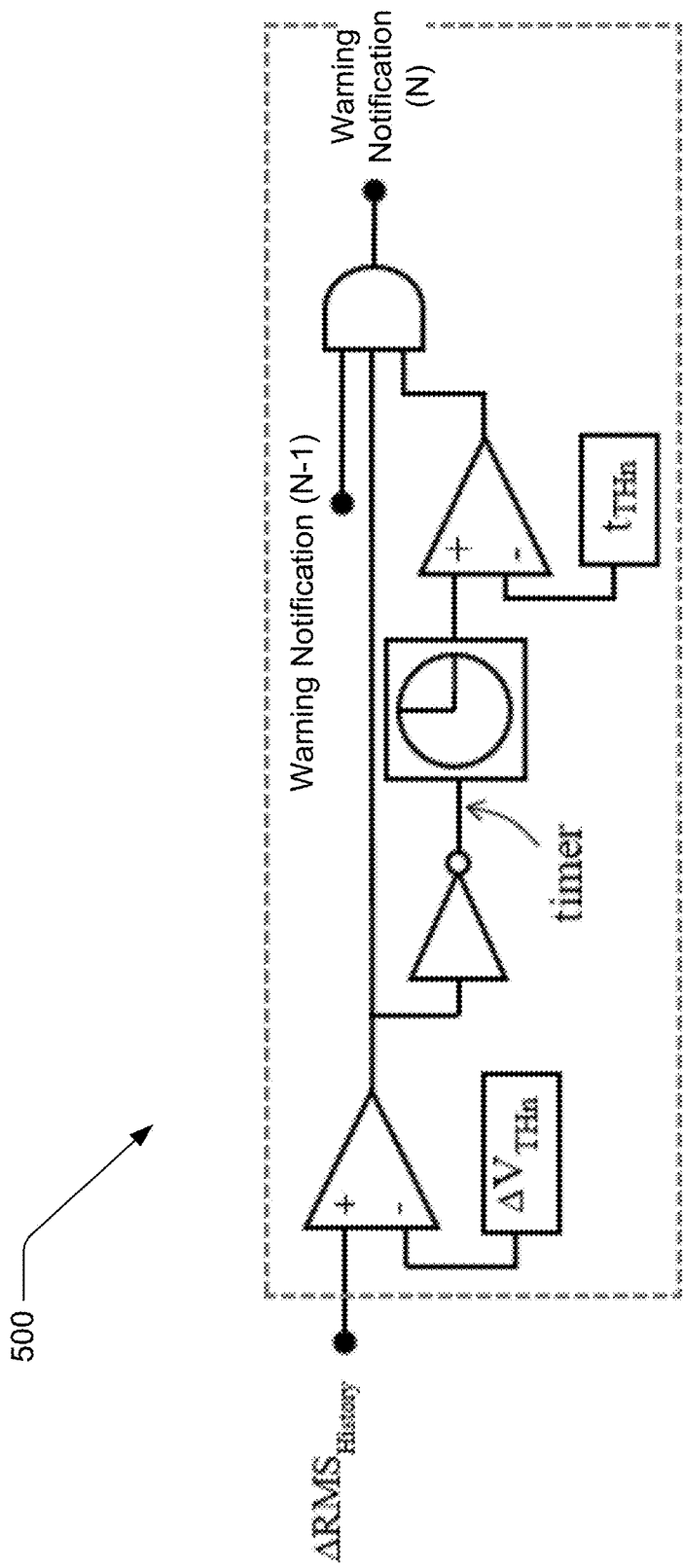
FIG. 5 illustrates an electrical schematic of an embodiment of a signal process flow that may occur within the microcontroller of an energy detection warning device.

Similar to FIG. 4, FIG. 5 depicts a schematic 500 of the signal process flow that may occur within the microcontroller of the device for determining whether to initiate a subsequent warning notification (N), where the prior warning notification is represented by N−1. In an embodiment, an energy detection warning device may initiate subsequent warning notifications in stages, and/or alternatively, in response to the changes in detected levels in accordance with the ASD process feature discussed above. For example, a subsequent warning notification may be initiated when the $\Delta RMS_{History}$ value exceeds a predetermined threshold $\Delta V_{THa}$ for a predetermined amount of time $t_{THn}$. Additionally, when the $\Delta RMS_{History}$ value is less than the threshold $\Delta V_{THn}$ or less than the threshold $\Delta V_{THn}$ for the predetermined amount of time $t_{THn}$, the timer is reset.

Illustrative Embodiment of Directional Sensing for a Warning Device

Figure 6:
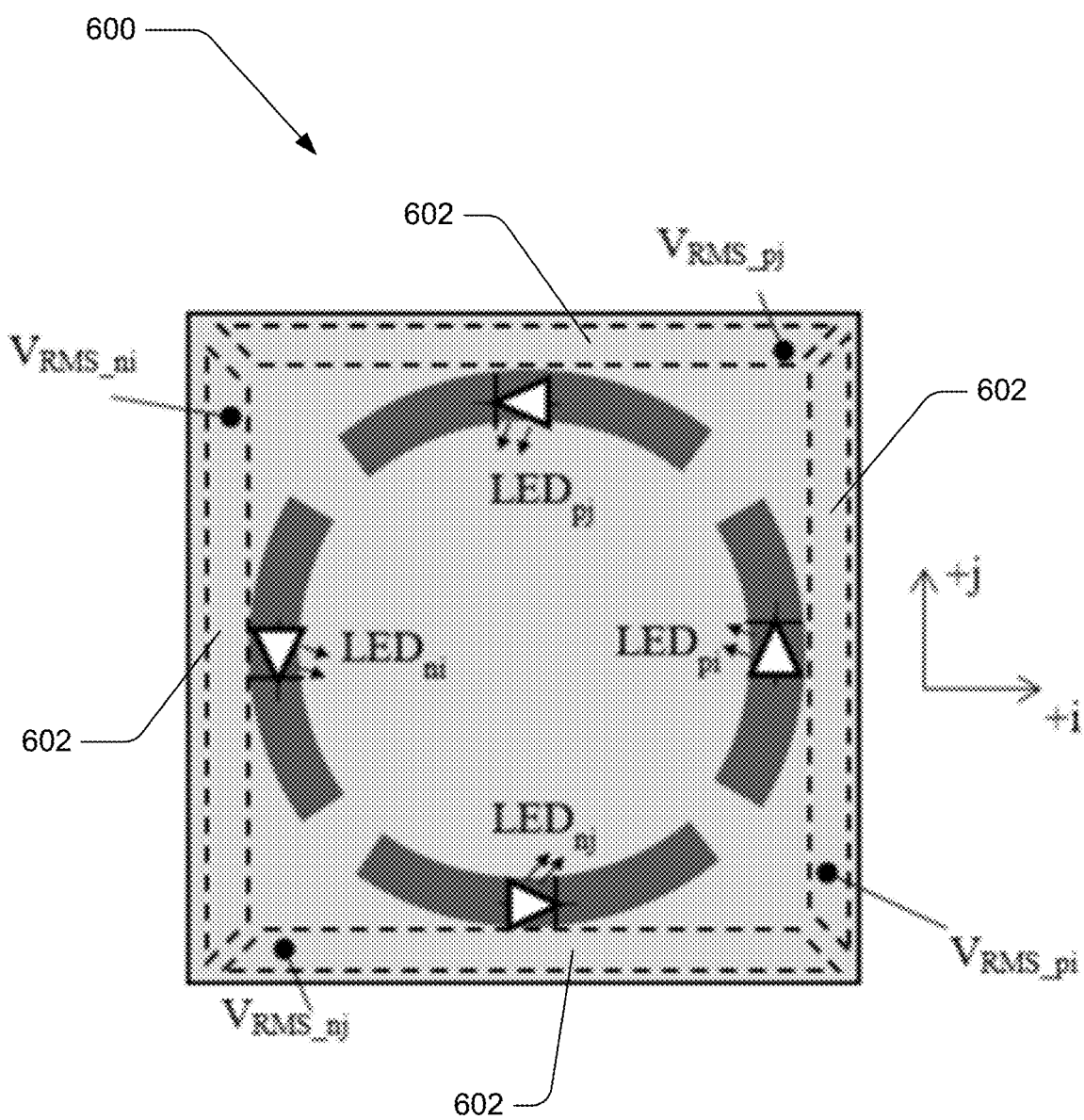
FIG. 6 illustrates a schematic view of an embodiment of an antenna arrangement for directional sensing of electromagnetic fields.

Referencing an embodiment of an energy detection warning device 600 as depicted in FIG. 6, since 1) the amplitude of the coupled signal relies on the capacitive coupling of the conductor to the capacitive plate, and 2) the capacitive coupling relies on the distance to the energized conductor, the direction of origin of the coupled signal relative to the energy detection warning device 600 may be made by using the amplitude of the signals received on capacitive antennas 602.

Using the RMS values for the signals detected on each of the capacitive antennas 602, a directional vector of the detected signal may be calculated using the RMS value of each respective antenna 602 as a component in the +i (pi), −i (ni), +j (pj), and −j (nj) directions, as depicted in FIG. 6, and as input in Equation 1 below.

Coupling Vector: $D_c = V_{RMS_{pi}}i + V_{RMS_{ni}}(-i) + V_{RMS_{pj}}(j) + V_{RMS_{nj}}(-j)$     Equation 1:

After calculating the directional vector using Equation 1, the vector (|Mag|=1) may be normalized to find the true direction of the detected signal, according to Equation 2 below.

Equation 2

Unit vector: $\vec{Dir_c} = \dfrac{\vec{D_c}}{|\vec{D_c}|}$     (Eqn.-2)

Knowing the true direction, in an embodiment, a directionally-oriented warning notification may be issued as follows. For example, in an embodiment arranged as shown in FIG. 6, one or more LEDs may be placed in alignment with each of the antennas 602. By decomposing the true directional vector into respective normalized directional components, a direction of an energized surface may be displayed to a user by varying the brightness, power status, and/or intensity of the one or more LEDs assigned to respective antennas 602. The adjustment of the LED status is based on the calculation results, which may be determined as shown in Equations 3-6 below. Note, in Equations 3-6, Re corresponds to the i component of the vector and Im corresponds to the j component.

(Re(Dir$_c$)>0)LED$_{pi}$Intensity=Re(Dir$_c$)[%]; else
LED$_{pi}$Intensity=0     Equation 3:

if (Re(Dir$_c$)<0)LED$_{ni}$Intensity=Re(Dir$_c$)[%]; else
LED$_{ni}$Intensity=0     Equation 4:

if (Im(Dir$_c$)>0)LED$_{pj}$Intensity=Im(Dir$_c$)[%]; else
LED$_{pj}$Intensity=0     Equation 5:

if (Im(Dir$_c$)<0)LED$_{nj}$Intensity=Im(Dir$_c$)[%]; else
LED$_{nj}$Intensity=0     Equation 6:

Additional Illustrative Embodiments of an Energy Detection Warning Device

Figure 7:
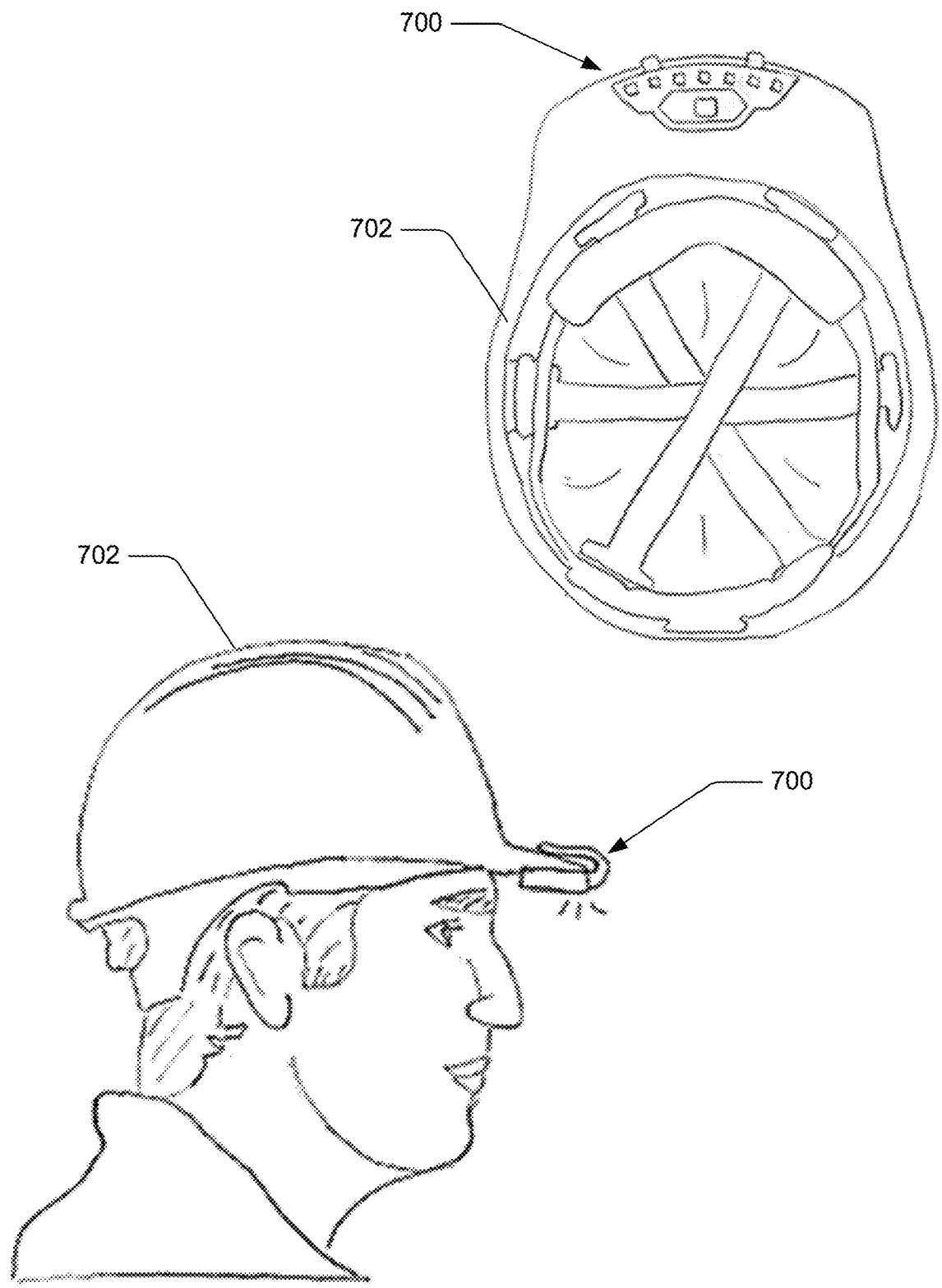
FIG. 7 illustrates a side view of a user wearing a wearable embodiment of an energy detection warning device, and a bottom view of a hat with the device attached thereto.

Additionally, and/or alternatively, as explained above, an energy detection warning device may be structured in various forms depending on use (e.g., manually portable, vehicle transported, location on body for wearable embodiments, etc.). In FIG. 7, a wearable embodiment of an energy detection warning device 700 is depicted as worn by a user, secured to the brim of a hat 702. Also depicted is a view of the device 700 attached to the hat 702 from a bottom side of the hat 702. As shown, the device 700 may have a curved structure along a front side that compliments the curvature of the brim of the hat 702. Further, as placed on the brim of the hat 702, the device 700 is positioned directly in the user's line of sight, which may assist the user in confirming the direction in which the device 700 may indicate is the direction of an energized conductor upon issuing a warning notification.

Figure 8:
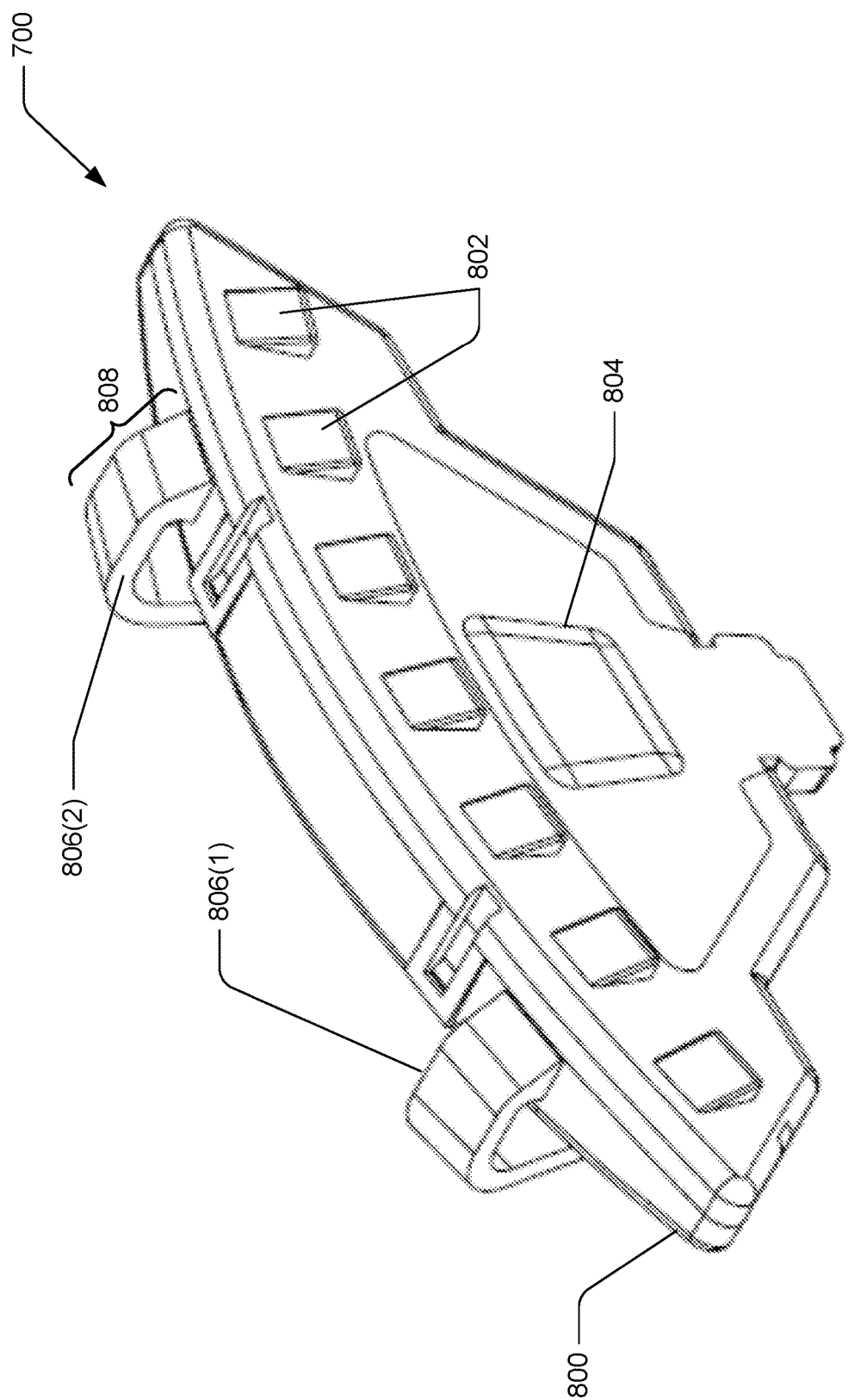
FIG. 8 illustrates a perspective view of an energy detection warning device according to an embodiment of the instant disclosure in FIG. 7.

FIG. 8 depicts a perspective view of the energy detection warning device 700. Device 700 may include a compact housing 800, sized to be unobstructive to a user's main line of sight, as well as easily portable. At the exterior of the housing 800, one or more downward facing LEDs 802 may protrude, completely or partially (i.e., one side or the other), from a bottom side of device 700, as depicted, or may be flush with housing 800 (not shown). LEDs 802 may be included as a visual warning notification component and may be white and/or one or more colors. The one or more LEDs 800 may align with the curvature of the device 700, so as to also align with the brim of the hat. As described above, the LEDs 802 may be used to communicate information regarding the threat level, threat type (high voltage, or high current), and location of the source to the user, upon initiation of a warning notification.

Housing 800 may also include a toggle 804, such as a pushbutton (shown) or other type of toggle switch. Toggle 804 may be used to power on or off the device 700, and/or act as an interactive member with one or more functions such as: muting alerts, checking battery life status, adjusting alert sensitivity, etc. Multiple functions may be accomplished, for example, by differing button hold-times, differing numbers of consecutive toggling, pressing on different sides/areas of the toggle 804, etc. Housing 700 may also include one or more fastening mechanisms 806 (e.g., a first fastening mechanism 806(1) and a second fastening mechanism 806(2)), such as the biased, living hinge clips shown, which curl against the top side of housing 800 to attach the device 700 to the brim of a hat or other similarly sized frame for attachment. For example, each of the first fastening mechanism 806(1) and the second fastening mechanism 806(2) may include a first portion 808 and a second portion 810. The first portion 808 may extend from a front (i.e., first side) of the housing 800 and/or a top (i.e., second side) of the housing 800. The second portion 810, which extends from the first portion 808, is disposed above the top of the housing 800, and extends towards a back (ie., third side) of the housing 800. The bias of the living hinge clips may be such that the amount of flexure is sufficient to allow a brim of a hat to be inserted between the top of the housing 800 and the clips, while upon release, the clips are flexed in a clamping position. It is contemplated that alternative suitable fastening mechanisms may be used in lieu of the living hinge clips shown.

Figure 9:
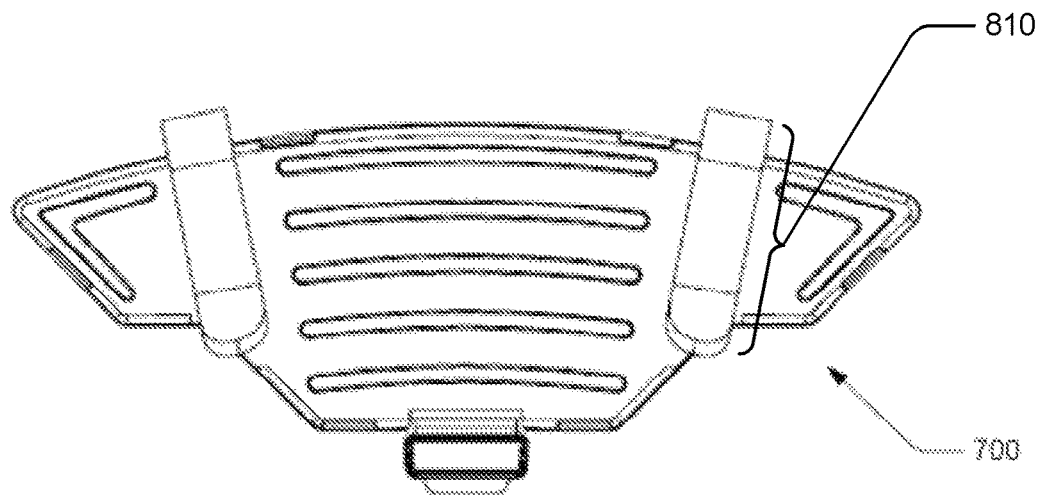
FIG. 9 illustrates a bottom, top, and side view of the energy detection warning device of FIG. 7 according to an embodiment of the instant disclosure.
Figure 9:
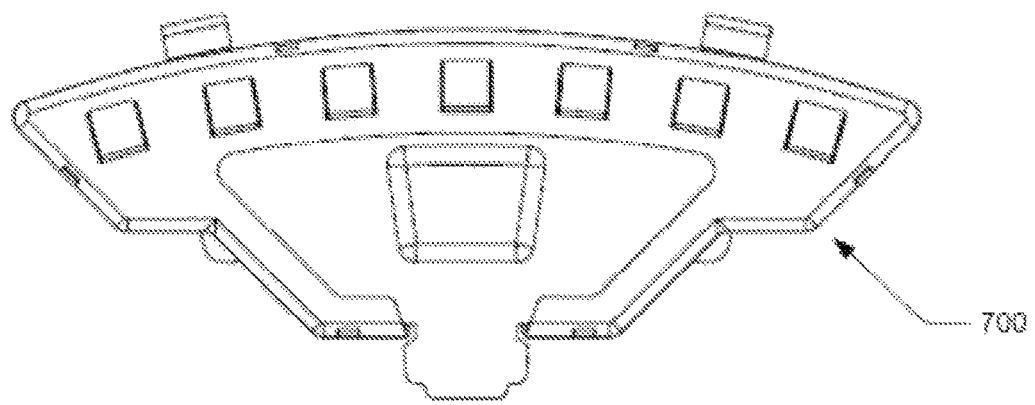
Figure 9:
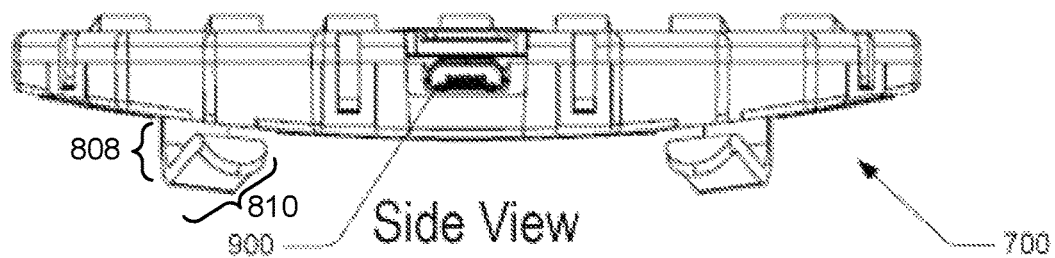

In FIG. 9, a top view, a bottom view, and a side view of the device 700 is shown. The side view depicts a connection port 900 via which device 700 may be charged and/or via which data may be transferred to or from memory in device 700 may be accessed. Connection port 900 may be any type of port suitable to charge a battery and/or access data. For example, connection port 900 may be a micro-B USB 3.0 connector, but is not limited to such.

Figure 10:
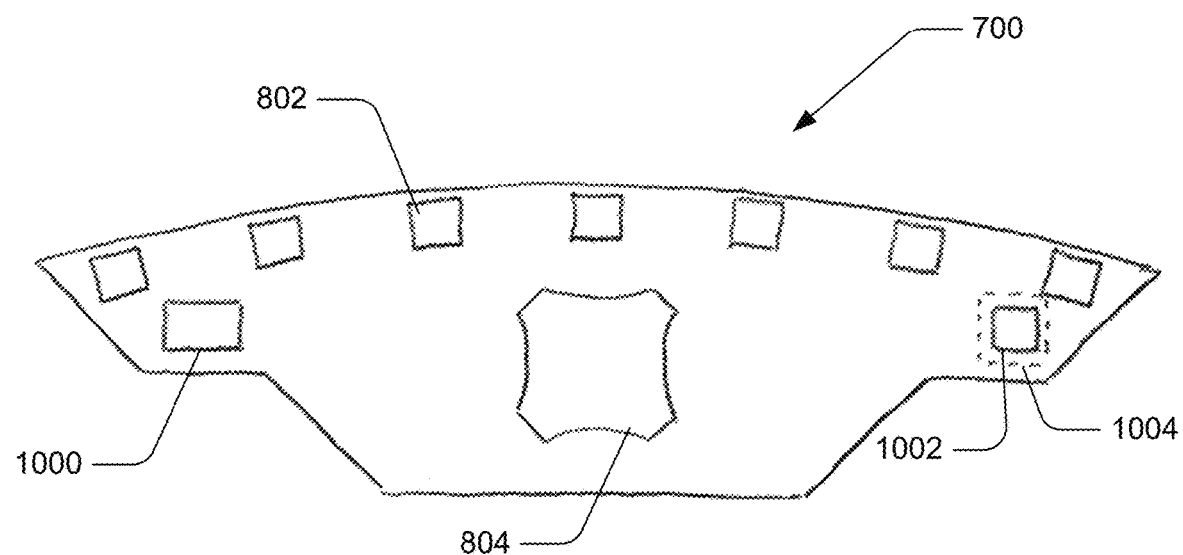
FIG. 10 illustrates a schematic component view of the energy detection warning device of FIG. 7 according to an embodiment of the instant disclosure.
Figure 11:
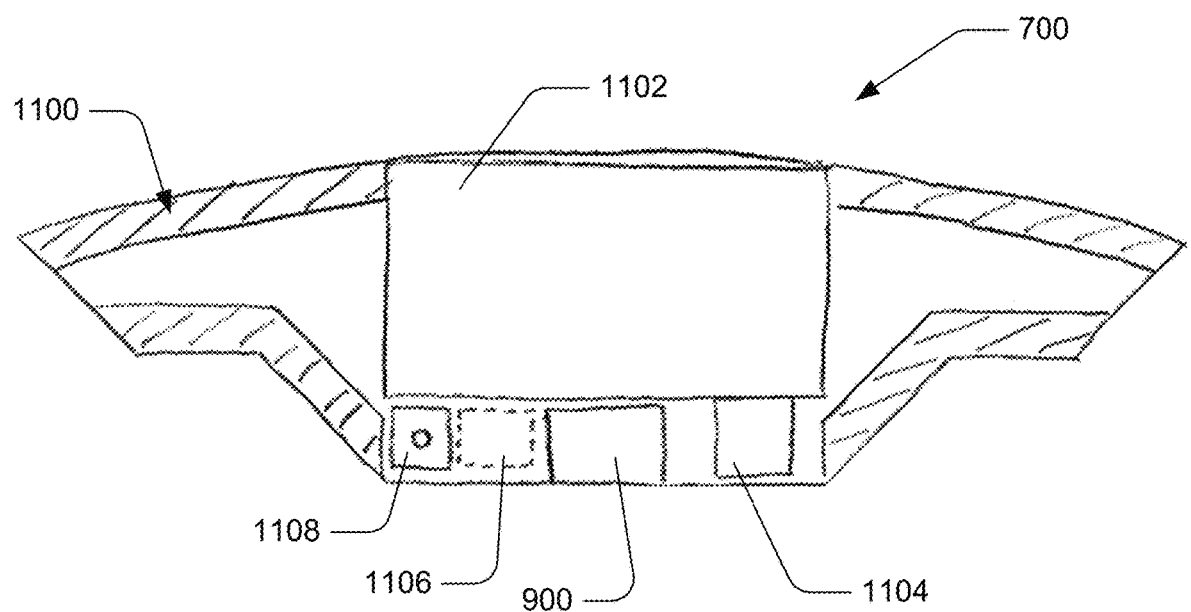
FIG. 11 illustrates another schematic component view of the energy detection warning device of FIG. 7 according to an embodiment of the instant disclosure.

As seen in the schematic view of FIG. 10, an embodiment of an energy detection warning device 700 may have additional sensor hardware including an accelerometer 1000 and a high-sensitivity 3-axis magnetometer 1002 that is paired with a high-permeability 3-axis flux concentrator 1004 used to measure the magnetic field in a field signal. In FIG. 11, additional sensor hardware may include a sensor 1100 to measure the electric field in a field signal. Also depicted schematically is a battery pack 1102, such as a rechargeable lithium ion polymer battery pack. Other types of battery packs may be suitable. FIG. 11 further illustrates: a microcontroller 1104 for controlling device 700; a battery charging circuit 1106 via which the battery pack 1102 may be charged; and one or more speakers 1108 via which audible warning notifications may be issued. The one or more speakers 1108 may include a variety of speakers, such as for example, a piezo-electric speaker.

Additional Illustrative Embodiments of Directional Sensing for a Warning Device

Figure 12:
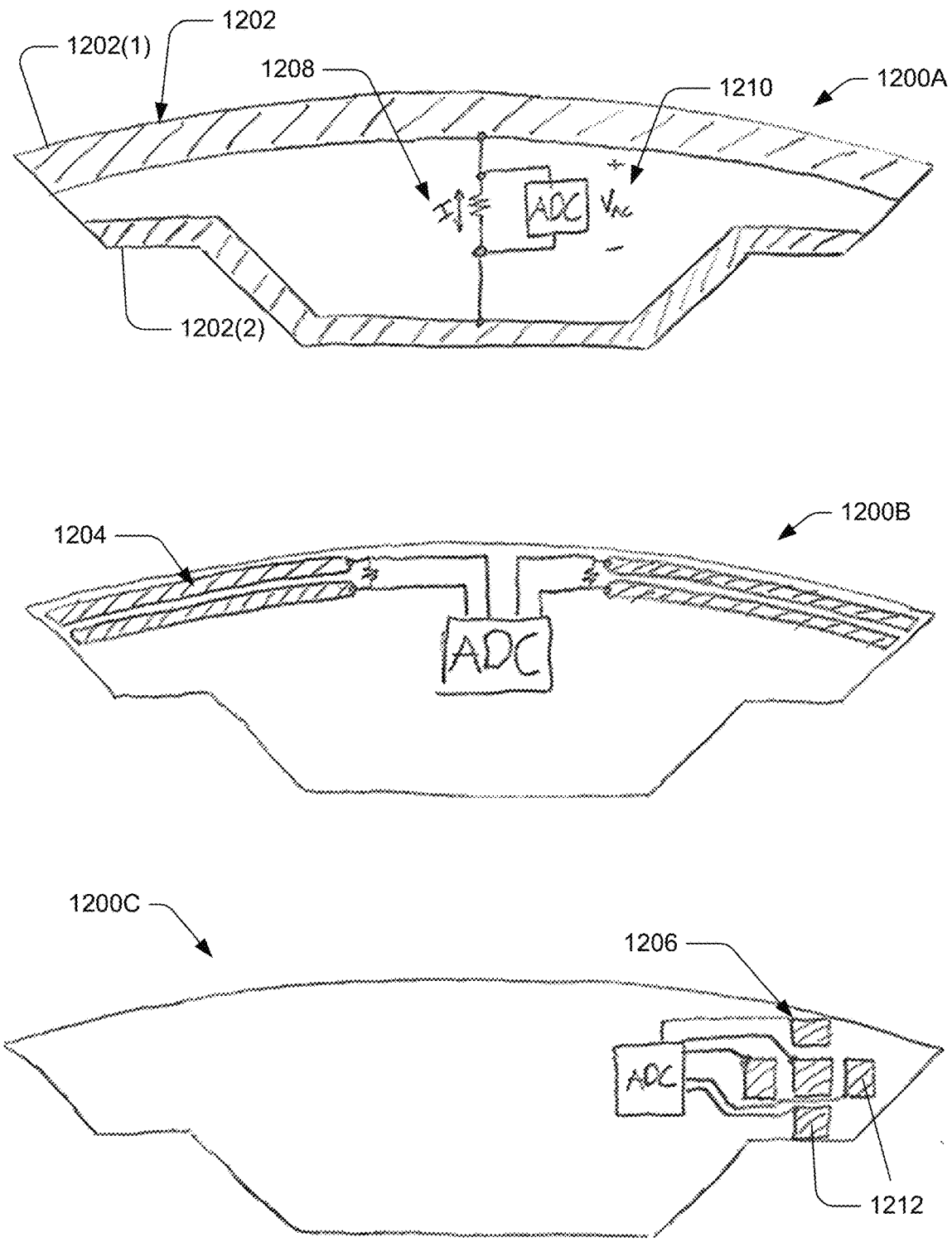
FIG. 12 illustrates variations of embodiments of electric field sensors according to the instant disclosure.

FIG. 12 illustrates three variations of electric field antenna configurations 1200A, 1200B, and 1200C that may be used as electric field sensors. Configuration 1200A depicts a sensor 1202, like the sensor 1100 shown in FIG. 11, which is a capacitively-coupled PCB parallel-plate antenna. Configuration 1200B depicts an embodiment of a sensor 1204 of a tri-parallel-plate capacitive electric field antenna. Configuration 1200C depicts an embodiment of a sensor 1206 of a capacitively-coupled PCB pad array antenna.

Sensor 1202 shown in configuration 1200A is a single directionally-tuned PCB capacitive antenna. In an embodiment, sensor 1202 may include two PCB conductive parallel-plates 1202(1), 1202(2) that are shorted through an impedance 1208. An AC electric field excites charge to be re-distributed back-and-fourth on the parallel-plates 1202(1), 1202(2), traveling through the shorted impedance 1208. The charge flowing through the impedance 1208 may generate a measurable AC voltage 1210, which corresponds to the measured electric field. Sensor 1202 yields a maximum measured AC voltage 1210 when the parallel-plates 1202(1), 1202(2) are oriented perpendicularly to electric field lines. Therefore, the orientation, of an energy detection warning device using a sensor 1202, at which the maximum peak voltage is measured may indicate the direction of an energized conductor with respect to the device.

As indicated above, with parallel-plate antennas, a maximum induced voltage may be detected when the electric field from an energized conductor is emanating in a direction substantially perpendicular to the lengthwise direction of extension of the parallel plates. Further, an electric field that is emanating in a direction substantially parallel or aligned with the lengthwise direction of extension of the parallel-plates may not induce a voltage. Thus, it is contemplated that in some instances when using sensor 1202, a situation may occur where the device may not accurately detect the presence or location of an electric field, for example, when the direction of the electric field is oriented parallel with the direction of extension of the antenna.

Figure 13:
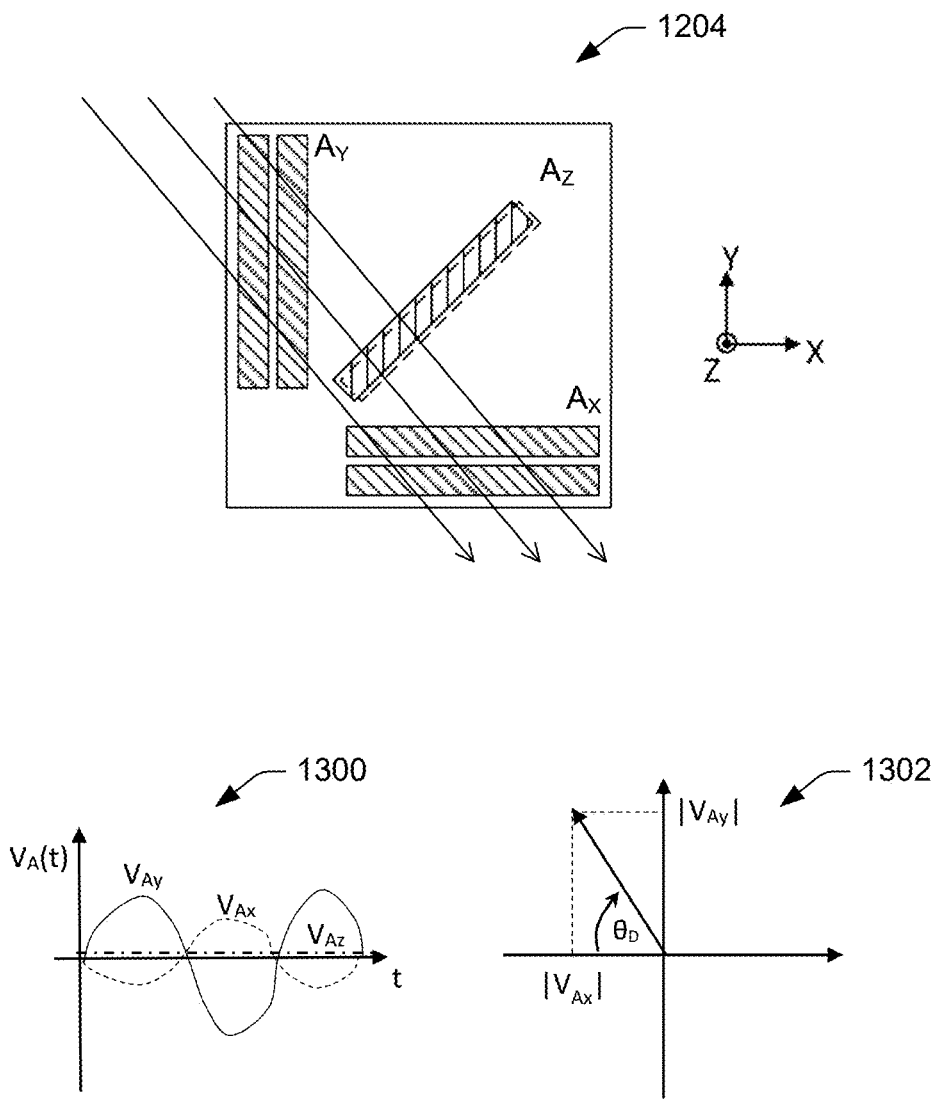
FIG. 13 illustrates a schematic component view of an embodiment of a sensor according to the instant disclosure.

Accordingly, in an alternative embodiment, an energy detection warning device may include sensor 1204 of configuration 1200B of a tri-parallel-plate capacitive electric field antenna. In contrast to sensor 1202, sensor 1204 implements three capacitively-coupled PCB parallel-plate antennas, each of which functions similarly as described with respect to sensor 1202 above. Furthermore, as illustrated in FIG. 13, by orienting each of a set of three parallel-plate antennas perpendicularly to each other, regardless of the emanating direction, at least one of the parallel-plate antennas may detect a nearby electric field, as the electric field cannot be parallel with all three antennas at the same time. Therefore, using sensor 1204, and assuming an electric field is detected by at least two of the three parallel-plate antennas (see graph 1300), the directional angle from which the detected electric field emanated may be determined by calculating the arctangent of the quotient of the detected RMS magnitudes between two of the three parallel-plate antennas with respect to a plane between the two antennas (see graph 1302, and see Equation 7 below).

Equation 7

$$\theta_D = \tan^{-1}\left(\frac{|V_{Ay}|}{|V_{Ax}|}\right)$$

In another alternative embodiment, an energy detection warning device may implement configuration 1200C with sensor 1206. As stated above, sensor 1206 may include a capacitively-coupled PCB pad array antenna, which uses a plurality of arranged pads 1212 instead of parallel-plates. In sensor 1206, the potential difference created by the electric field among the array of pads 1212 may be measured. Upon detection of an electric field, the measured RMS voltage values detected by the various pads 1212 may be analyzed, and since the pads closer to the energized conductor may experience a slightly larger induced voltage than pads positioned further away, a general indication of the direction of the location of the energized conductor may be determined according to the position of the pads in the array.

Regardless of which embodiment of electric field sensor is selected, a component that may assist in locating the energized conductor is the accelerometer 1000, mentioned above. In an embodiment, the accelerometer 1000 is used for measuring the roll and the pitch of the warning device, when worn on a user's hat. The roll and pitch measurements may be used for tilt-compensated heading calculations to achieve reliable compass degrees-heading measurements with any roll or pitch changes. Further, tilt-compensated heading calculations may be used for voltage directional-sensing techniques, which match electric-field peaks to the degrees-heading as a user, when wearing the warning device on a hat, sweeps his or her head back-and-fourth naturally.

Figure 14:
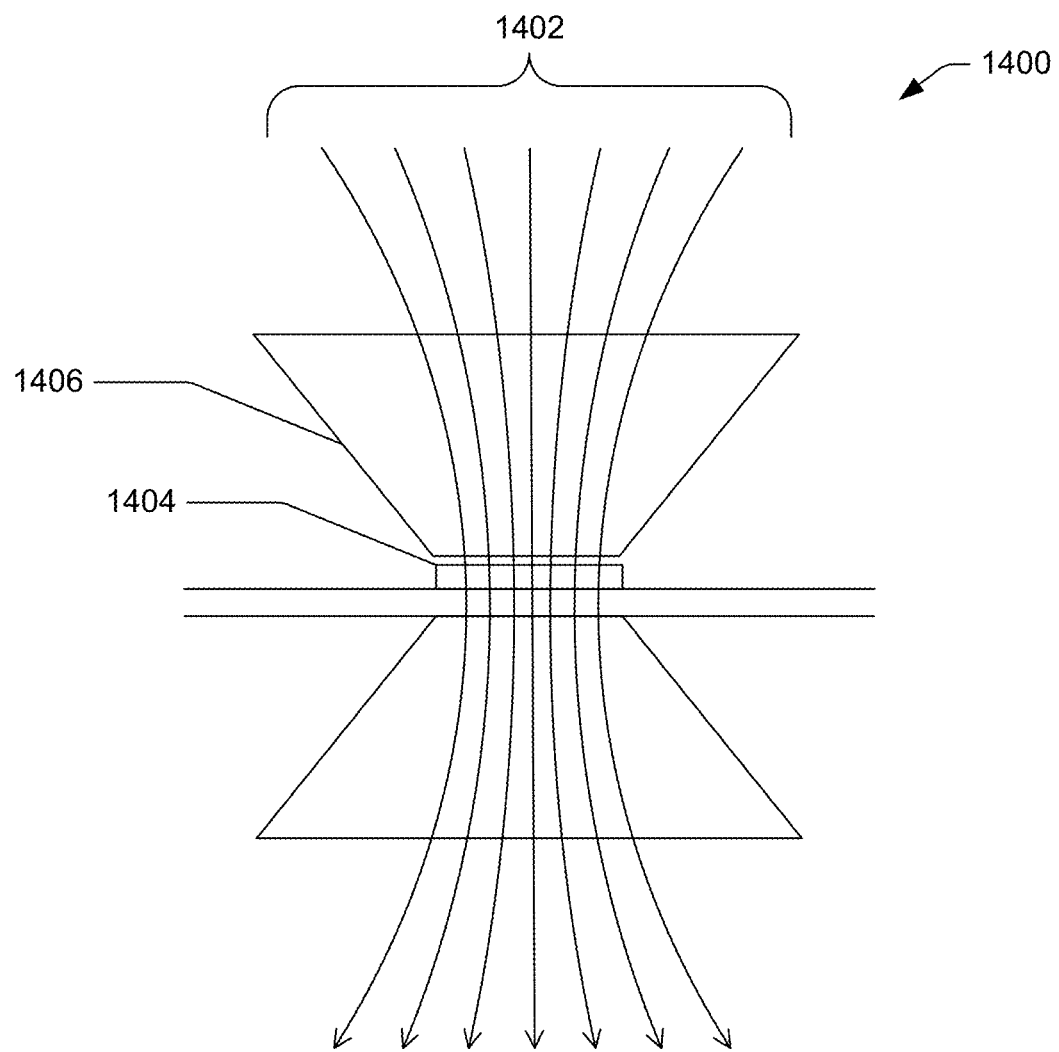
FIG. 14 illustrates the effects of a magnetometer and flux concentrator according to an embodiment of the instant disclosure.

Turning to detection of a magnetic field, as stated above, an energy detection warning device may include a high-sensitivity 3-axis magnetometer paired with a high-permeability 3-axis flux concentrator, for example. FIG. 14 depicts a simulation 1400 of a magnetic field 1402 as affected by a digital magnetometer 1404 and a flux concentrator 1406, according to an embodiment of the instant disclosure. Using digital magnetometer 1404 and flux concentrator 1406 to focus the magnetic flux into the sensor area of digital magnetometer 1404, the vector information of the magnetic field may be calculated.

Accordingly, an energy detection warning device may incorporate both an electric field sensor and a magnetic field sensor, and may use measurements from one or both sensors to provide a user with an approximate direction of the location of an energized conductor with respect to the location and orientation of the device.

Additional Illustrative Embodiments of Directional Sensing for a Warning Device

Figure 15:
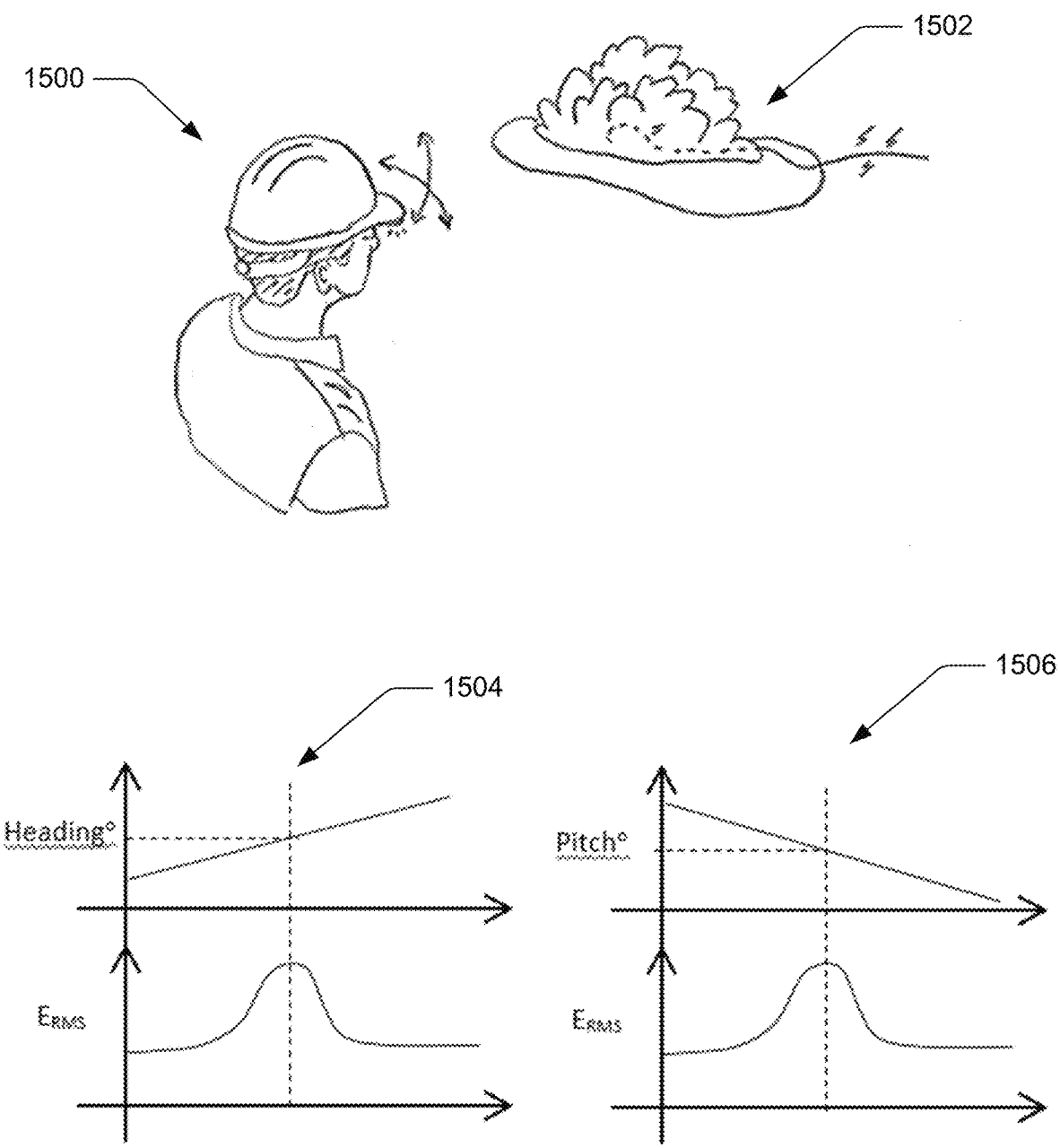
FIG. 15 illustrates a user in an environment with a hidden energized conductor and graphs related to the measured field when a wearable energy detection warning device is tilted and rotated according to an embodiment of the instant disclosure.

With respect to FIG. 15, a user 1500 may wear a wearable embodiment of an energy detection warning device on a brim of a hat, as shown, while working. In an event where user 1500 is unaware of an energized conductor 1502 that may be hidden, the device may assist user 1500 in detecting and locating the energized conductor 1502 while the user 1500 scans an area with natural rotation and tilting of the user's head, either while at rest or walking. For example, in an embodiment, a warning device may measure a largest RMS voltage value when the device and user are looking directly in the direction of the energized conductor 1502. Thus, as the user's head turns side-to-side or up-and-down, the magnitude of the measured electric field may be at a peak when looking directly at the point of closest contact on the energized conductor 1502. This peak in electric field magnitude is associated with a tilt-compensated degree-heading (see graph 1504, for example) or a degree-pitch (see graph 1506, for example) value, which depends on whether the user's head was turning side-to-side or up-and-down.

Figure 16:
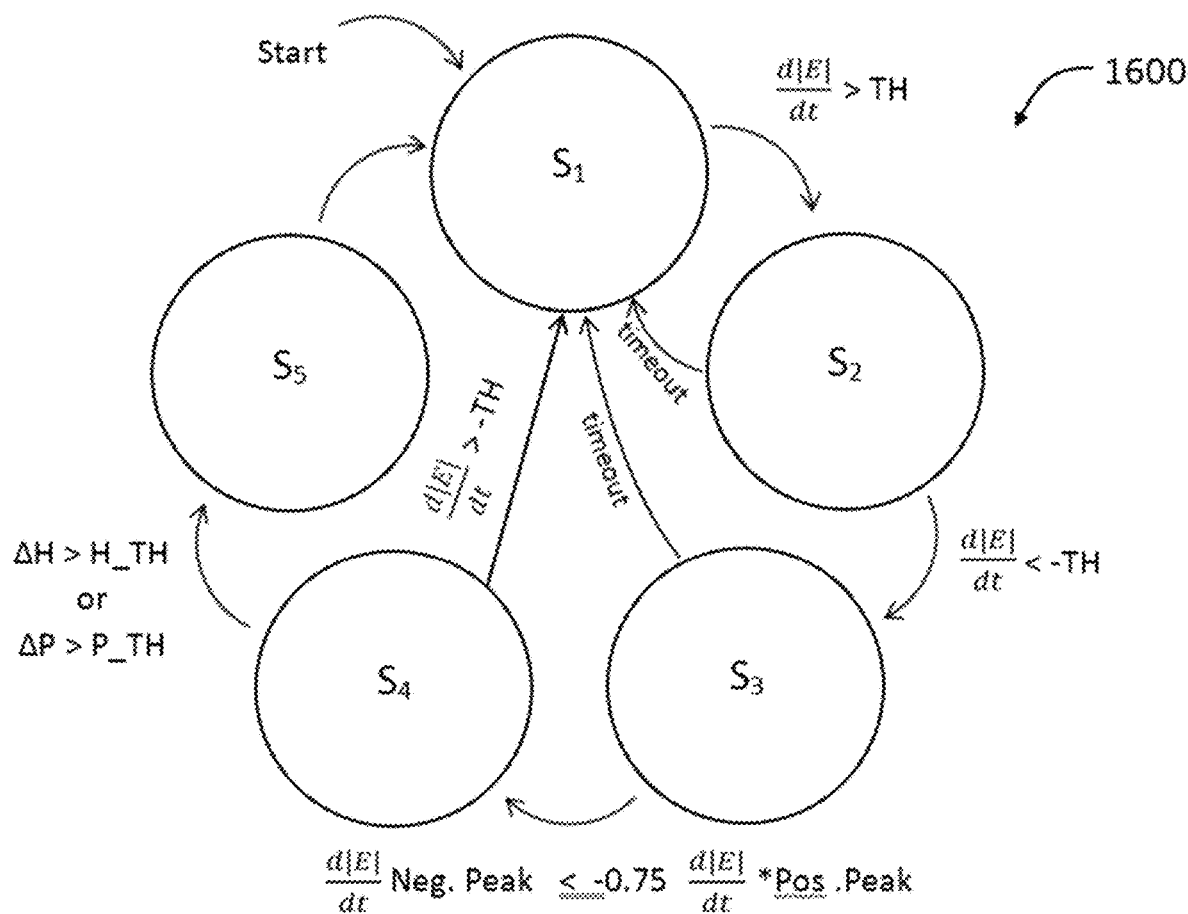
FIG. 16 illustrates a schematic representation of a mealy finite state machine used for voltage directional detection as used in an embodiment of the instant disclosure.
Figure 16:
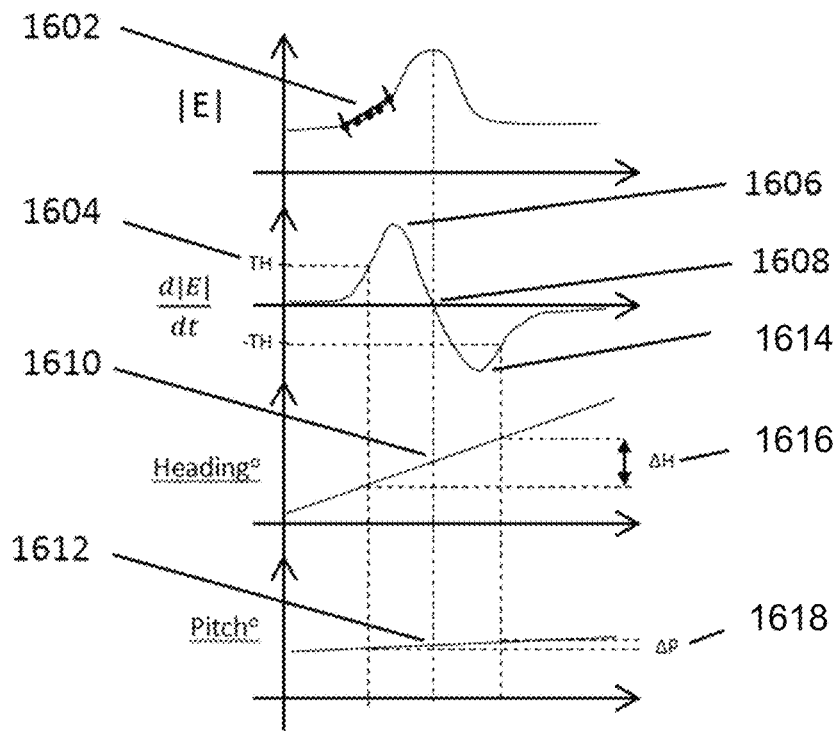

Referring to FIG. 16, in an embodiment, the microcontroller may determine a direction of the energized conductor using a mealy finite state machine 1600 to recognize the peak pattern. Inputs to the state machine 1600 may include: the slope of the measured electric field magnitude ("dE/dt"), time ("t"), tilt-compensated degrees heading ("H") (hereinafter "degrees heading", and pitch ("P"). The slope of the measured electric field may be calculated using a bar-array 1602 for improved calculation stability where the slope is calculated as Equation 8 below, where "first" and "last" are the first and last elements in the memory array.

$$dE/dt = E[\text{First}] - E[\text{Last}]/(t[\text{First}] - t[\text{Last}]) \quad \text{Equation 8:}$$

Starting in state 1 $S_1$, the state machine 1600 remains in state 1 $S_1$ until the slope dE/dt to cross an activation threshold TH 1604. When the slope dE/dt crosses the activation threshold TH, the state machine 1600 advances from state 1 $S_1$ to state 2 $S_2$.

At the beginning of state 2 $S_2$, a starting timestamp (t_start), a starting degrees heading (heading_start), and a starting pitch (pitch_start) are saved in memory. At this point, the positive peak 1606 and zero-crossing 1608 of the slope dE/dt are saved in the memory. The zero-crossing of the slope dE/dt corresponds to the peak of the electric field magnitude (i.e., slope is zero at the peak). At the point that the slope dE/dt reaches zero-crossing, the value of each of the degrees heading 1610 and pitch 1612 at that instant are associated with that point, as the degrees heading 1610 and the pitch 1612 relate to the direction of the energized conductor. At the point that the slope dE/dt is less than a negative value of the activation threshold TH (i.e., −(TH)), the state machine 1600 advances from state 2 $S_2$ to state 3 $S_3$. In the event, however, the state machine 1600 remains idle in state 2 $S_2$ for more than a time period $T_{timeout}$ from t_start (t_now−t_start>$T_{timeout}$), the state machine 1600 times out and is reset, reverting from state 2 $S_2$ to state 1 $S_1$.

In state 3 $S_3$, the negative peak 1614 of the slope dE/dt is evaluated. During the evaluation, if the negative peak 1614 for the slope dE/dt is evaluated to be less than a calculated value of −0.75*dE/dt*positive peak, the state machine 1600 advances from state 3 $S_3$ to state 4 $S_4$. In the event, however, the state machine 1600 remains idle in state 3 $S_3$ for more than a time period $T_{timeout}$ from t_start (t_now−t_start>$T_{timeout}$), the state machine 1600 times out and is reset, reverting from state 3 $S_3$ to state 1 $S_1$.

In state 4 $S_4$, the state machine 1600 is configured to verify whether the electric field magnitude peak was due to head movement and not a different action. During stage 4 $S_4$, a change in degrees heading ("ΔH") 1616 and a change in pitch ("ΔP") 1618 are measured. In the event that either of the change in degrees heading 1616 or the change in pitch 1618 becomes larger than activation degrees heading and pitch thresholds (i.e., H_TH and P_TH), respectively, the state machine 1600 advances from state 4 $S_4$ to state 5 $S_5$. In the event, however, the slope dE/dt rises above the negative value of the activation threshold−(TH), the state machine 1600 is reset, reverting from state 4 $S_4$ to state 1 $S_1$.

In state 5 $S_5$, the degrees heading 1610 or pitch 1612 to the energized conductor is confirmed and updated in firmware as the value that was recorded when the slope dE/dt reached zero-crossing 1608 in state 2 $S_2$. After completion of recording the degrees heading 1610 or pitch 1612, the state machine 1600 is reset, reverting from state 5 $S_5$ back to state 1 $S_1$.

Figure 17:
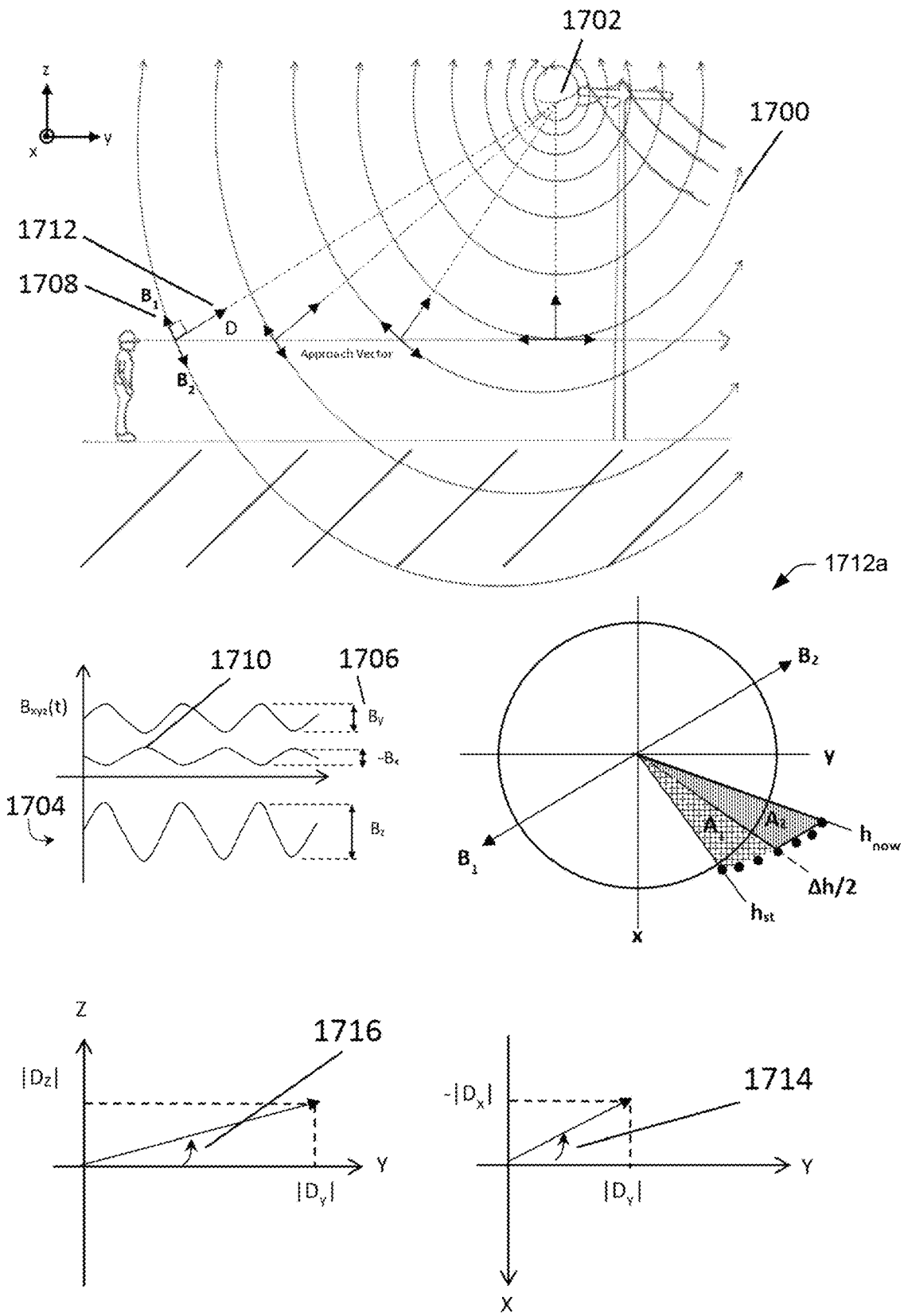
FIG. 17 illustrates an example scenario of a user in the presence of a magnetic field and graphs related to the measurement and data associated with the detection of the magnetic field used for directional detection of current-carrying wire, according to an embodiment of the instant disclosure.

Additionally, and/or alternatively, in an embodiment of the energy detection warning device, the approximate direction of an energized conductor may also be determined using magnetic field measurements. With respect to FIG. 17, the magnetic field 1700 for an energized conductor 1702 (e.g., a live power line as shown) that is carrying current, is found using the right-hand rule and can be drawn as a circle around the energized conductor 1702, where the magnetic field 1700 is always perpendicular to the energized conductor 1702.

In an embodiment of the warning device that includes a high-resolution 3-axis magnetic field sensor (as discussed above), the time-varying AC magnetic field signals 1704 created from the energized conductor 1702 are measured. The measured outputs of a 3-axis magnetometer may include X-axis, Y-axis, and Z-axis time-varying sinusoidal magnetic field data 1704. The magnetic field Y-axis AC RMS value 1706 corresponds to the Y-axis vector component of the magnetic field vector B 1708, where a negative sign is added to axis components 180-degrees out of phase 1710 with the reference axis, where the x-axis is chosen as the reference axis. Similarly, the magnetic field X-axis and Z-axis AC RMS components correspond to the magnetic field vector 1708 components X and Z, respectively.

In the event the magnetic field Z-axis RMS component is larger than the Y-axis or X-axis component, the energized conductor 1702 may be sensed as oriented horizontally. In contrast, in the event that either of the magnetic field X-axis or Y-axis RMS component is larger than the Z-axis component, the energized conductor 1702 may be sensed as oriented vertically.

The direction vector D 1712, which represents the direction to the energized conductor, may be determined by taking the magnetic field and projecting it onto the x-y axis. This yields a dual-direction vector, where vector D 1712 could be one of two directional vectors (B1, B2) which are 180 degrees out of phase. To determine vector D 1712, field data on a range of heading is saved. Of the active range of data saved, the range is split in half and the areas (A1,A2) under the magnetic field data curve may be calculated, as shown in graph 1712a. Whichever half has a greater area may determine which directional vector is the true direction. Additionally, the degrees heading 1714 and pitch 1716 to the energized conductor 1702 may be calculated as the arctangent of the quotient of the X-axis component divided by the Y-axis component, as well as the arctangent of the quotient of the Z-axis component divided by the Y-axis component of the direction vector 1712, respectively.

Illustrative Embodiment of a Method of the Warning Device

Figure 18:
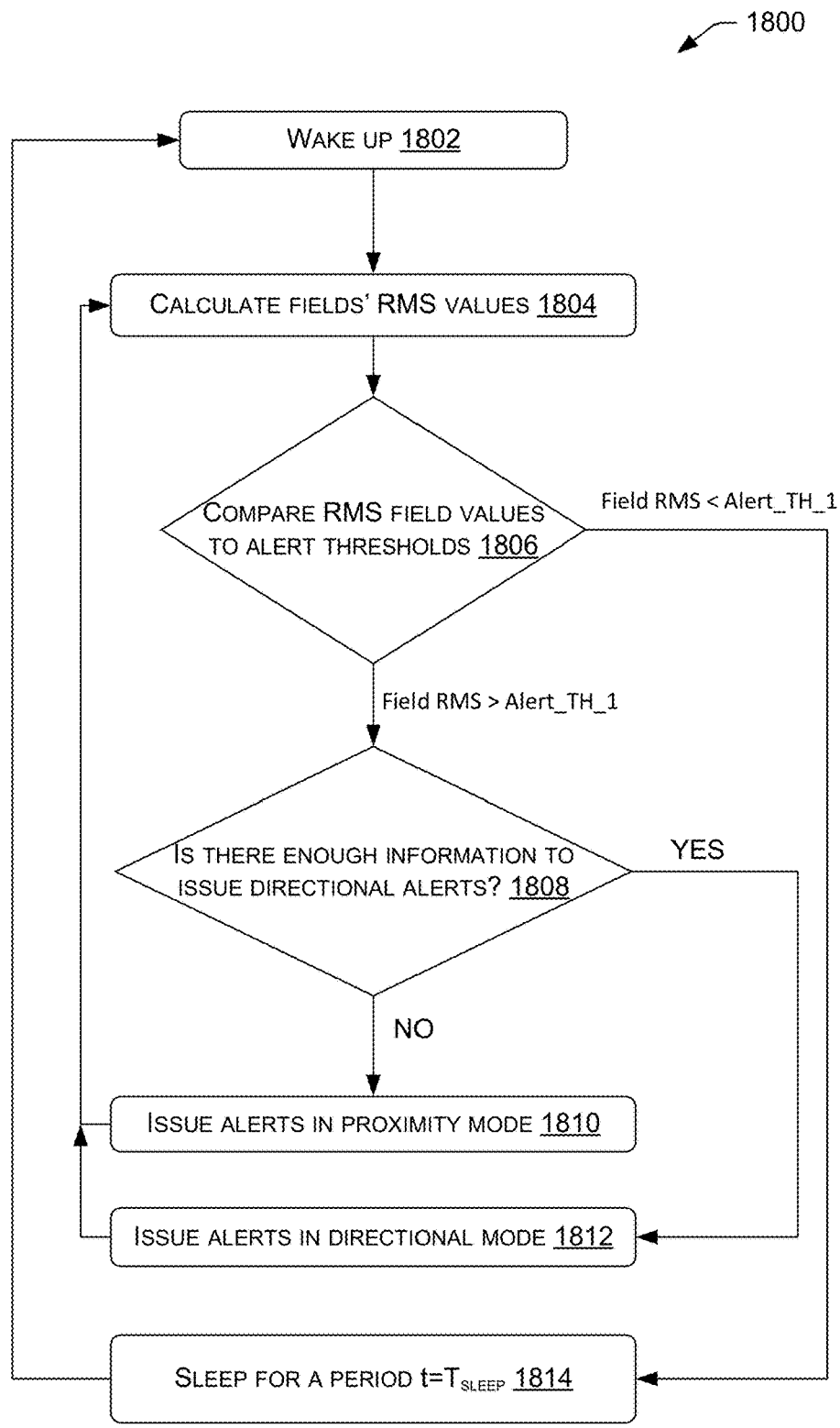
FIG. 18 illustrates an embodiment of a control flow process schematic according to the instant disclosure.

In FIG. 18, an embodiment of a control flow diagram 1800 is illustrated, according to an embodiment. The control flow diagram 1800 describes how an energy detection warning device may process information from the sensors, determines how to communicate risk information to a user, issues warning information using notification system hardware to the user, optimizes battery life, and obtains and communicates relevant safety information to a cloud-based server. In general, the microcontroller may: digitize the analog outputs from the sensors, convert AC electric and magnetic field values to DC equivalent RMS values, compare these values to alert thresholds based on user-controllable sensitivity settings, uses the notification hardware to issue audible, visual, and tactile alerts based on the threat level and the direction to the source, etc. The method may further optimize battery life by putting the warning device into a low-power sleep state when not being used (e.g., not being moved or using accelerometer), as well as when the strength of any environmental electric field and magnetic field is below a safe threshold.

In an embodiment, an energy detection warning device may implement a "Wake-and-Sense" process, which may extend the battery life while simultaneously allowing the device to be powered on substantially continuously. For example, the processor and hardware may be run in a low-power sleep state during at least a portion of the time when the warning device is in a safe environment, or when the warning device is not in service as intended, which may depend on the particular embodiment, whether wearable, transportable, etc., and is stationary for an extended amount of time. Further, when measured field (electric and magnetic) values are below a sleep-threshold, such as a normal ambient field, a warning device may be configured to sleep for a time period $T_{sleep}$, wake up according to a predetermined periodic cycle, and sense/observe the environment for a dangerous electric or magnetic field for a time $T_{awake}$. During the awake time, if the measured fields remain below a safe threshold, the warning device may return to sleep for a period of time $T_{sleep}$. However, if, during the awake time, the measured field values are rising and cross over the safe threshold, the warning device becomes fully powered, waking up, and begins tracking the historical field signal magnitudes and determines whether to issue warning signals, for example, when signal magnitudes cross the alert thresholds.

Accordingly, an embodiment of method 1800 according to the instant disclosure, may include a step of waking up 1802. In step 1804, the RMS values of the environmental electric and/or magnetic fields may be calculated. With the RMS values calculated in step 1804, the values may be compared to predetermined alert/warning threshold values as step 1806. As indicated above, if it is determined in step 1806, that the calculated RMS value is greater than the alert threshold, then a determination is made in step 1808 of whether there is enough information to issue directional alerts. If there is not enough information, then the method 1800 advances to step 1810, in which alerts may be issued in a proximity mode. In the proximity mode, the warning device detects a field having a significant threat level of an energized conductor, however, the information is insufficient to also indicate the direction of the energized conductor. In step 1808, however, in the event there is enough information for a directional alert, method 1800 advances to step 1812, in which a warning alert may be issued in directional mode, via which the warning device may indicate to a user the approximate directional location of an energized conductor. After either step 1810 and/or step 1812, the method 1800 may be configured to revert to step 1804 (i.e., the warning device is silenced or the alarm duration expires as the device adapts to the detected field levels), and the warning device is reset to be available to begin determining whether to issue another alert, as previously discussed.

Turning back to method step 1806, in the event that the calculated RMS field value is below the alert threshold, method 1800 may bypass steps 1808, 1810, and 1812, advancing directly to step 1814. In step 1814, the warning device may sleep for the predetermined time period $T_{sleep}$, before cycling back to step 1802, at which point, the warning device wakes up.

Illustrative Embodiment of Self-Test for a Warning Device

In an embodiment, an energy detection warning device may further be configured to execute a self-test to ensure proper functionality in a work environment. For example, in some instances, a warning device may include a secondary PCB antenna disposed proximate to a primary antenna. The secondary antenna may apply a 60 Hz square-wave (PWM) signal, which couples to the primary antenna for verification of correct hardware/firmware behavior. Furthermore, in an internal self-test on the magnetometer, a PCB coil around the magnetometer may generate a small magnetic field, which the sensor reads. Moreover, in an embodiment, the self-test may be periodically issued. In the event that a sensor failure is discovered, the warning device may enter a failure/mode state, during which time the notification hardware may issue one or more warnings. For example, the warning device may be programmed to have LED indictors illuminated red in the event of failure to pass the self-test.

Example Implementation of Directional Sensing Process

Figure 19:
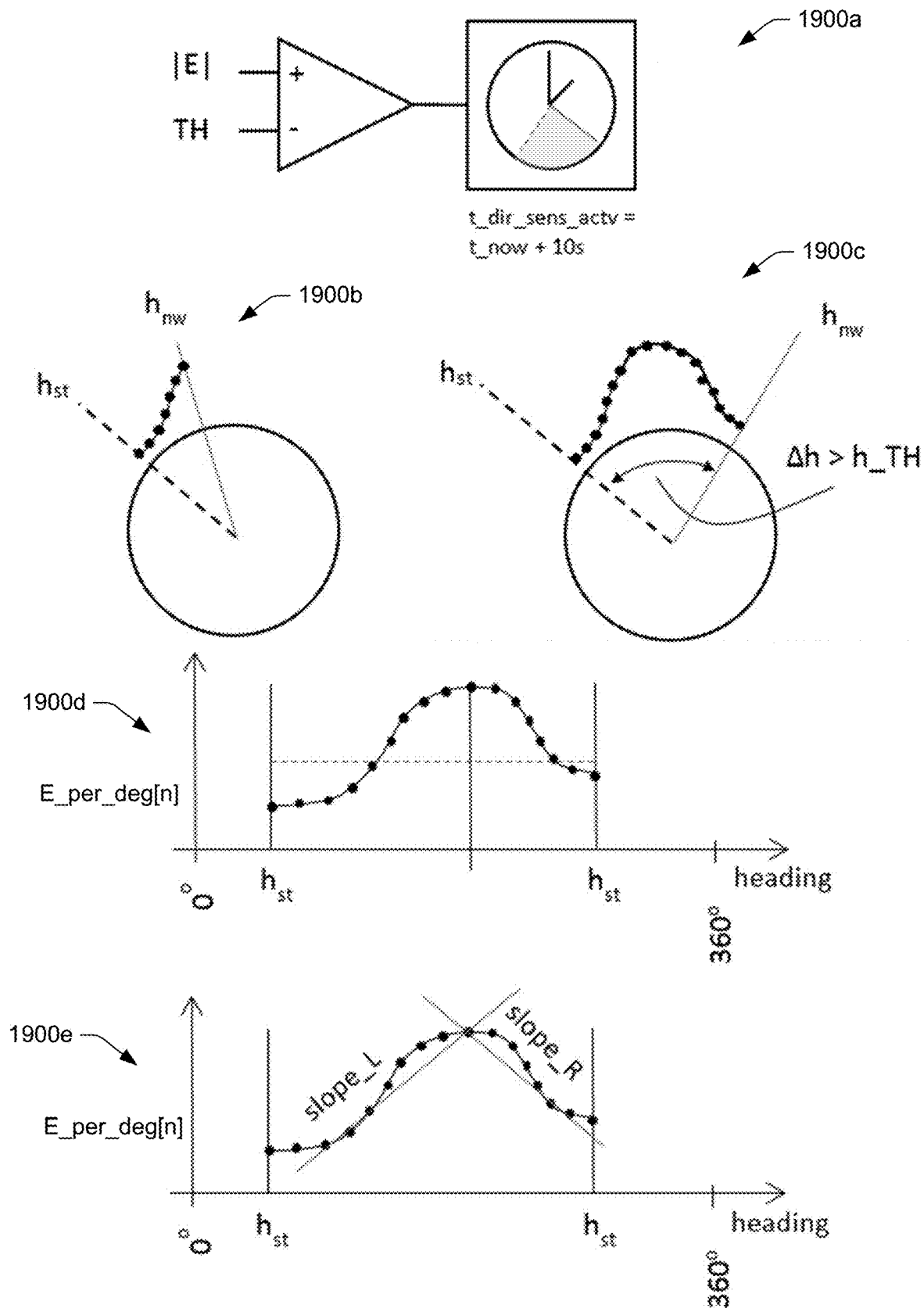
FIG. 19 illustrates schematic representations and graphs correlating to an embodiment of a directional sensing process according to the instant disclosure.

With respect to the schematics and graphs (1900a-1900e) depicted in FIG. 19, the following description explains an example of a directional sensing process according to an embodiment of the instant application. The following process steps or phases may occur, for example, when a user approaches an energized conductor while wearing an energy detection warning device, during which time, the warning device is taking measurements of the ambient electric and/or magnetic fields.

Initial Action Trigger: In response to a measured field |E| crossing an activation threshold, a directional sensing process is time-latched ON for 10 s, for example. Upon activation, the starting heading $h_{st}$ is saved in a memory of the device. While the process is active, the field |E| is associated with the current degrees heading by saving the values in an array with 360 elements, where the n-th element represents the field magnitude at that degree heading (0 to 360 degrees). Note, in an embodiment, the full heading range (0 to 360 degrees) may be partitioned in a range of 2 degrees to 5 degrees, for example, per n-th element to optimize processing efficiency. Additionally, electric field magnitudes may be saved to the array element (corresponding to the current direction) using an IIR filter, not overwritten. Furthermore, array elements may be slowly depreciated equally until the respective values are zero.

Subsequent Action Trigger: The process continues to add data to the array until a range in degrees of information has been captured (e.g., 20 degrees, 30 degrees, 40 degrees, etc.). In response to the difference between the starting heading and the current heading Δh becoming greater than h_TH, the activation range threshold (e.g., 20 degrees, 30 degrees, 40 degrees, etc.), the device is configured to check the data set for an electric field peak condition, which may represent a direction to a field source (i.e., energized conductor).

Peak and AVG Calculated: If Δh>30 deg, for example, the process may continue by scanning through the data set looking at the active range, which are values above a certain threshold signifying data at the location was recorded. While scanning through the data, the peak and AVG are determined. The AVG of the data-set is calculated to measure how drastic the bell-curve is, for process reliability, for example. Generally, for relatively small disturbances in the data-set, it is unnecessary to trigger a warning notification. As such, (peak>X*AVG) is an activation control term.

Peak Condition: In response to locating the peak, the process may verify the peak condition by validating a positive slope to the left of the peak and a negative slope to the right of the peak. In an embodiment, the slopes may be determined using the following: E_per_deg[n_mode]−E_per_deg[n_mode−5]>0 (must be greater than zero) (or >slope_TH) and E_per_deg[n_mode]−Eper_deg[n_mode+5]<0 (must be less than zero) (or <slope_TH).

Example Uses of Smart Data Tracking with Warning Device

As discussed above, the energy detection warning device may include memory and data transmission hardware and/or software to allow communication with the device at any time. This transmission may be achieved by any suitable means known for intercommunication between other electronic devices (e.g., phone, smart vehicle connections, tablet, laptop, etc.), including but not limited to: Bluetooth®, digital cellular data transfer, wired, wireless, radio wave, li-fi, wi-fi, etc.

In an embodiment, for example, while a user may be alerted to the presence of an energized conductor, the device may also, immediately or at a later time, transmit a notice of the detection to a parent company for analysis. An immediate and automatic notification may assist a company in providing urgent care in the case of an accident occurring subsequent to the notification, for example if a user is hurt and unable to physically notify someone. Such data may be visible in aggregate as well, and may be used to determine: employee and/or team and/or managerial behavior characteristics/trends, whether good or bad; frequency of users being placed in dangerous situations; risk reduction; cost reduction; improvement opportunities for safety and efficiency efforts; frequency of situations that nearly ended in accidents; geographically-based trends with respect to risk and employee behavior, as well as user location tracking and compromised equipment tagging; communication connectivity challenged areas for improvement; work time tracking, whether to determine inactivity or over-activity; supplement needs of workers instantaneously (e.g., send help/senior employees as needed); whether users are properly using the device (e.g., is the hard hat being worn?); length of exposure to risk-filled environments (e.g., EMF, poor weather, cramped locations, etc.); efficiency improvements; etc.

EXAMPLE CLAUSES

A: A device, comprising: a housing; one or more lighting elements disposed within the housing; one or more speakers disposed within the housing; at least one of a voltage detector or a current detector disposed within the housing; one or more processors; and one or more computer-readable media storing instructions that, when executed, cause the one or more processors to perform operations including: receiving sensor data from the at least one of the voltage detector or the current detector, determining, based at least in part on the sensor data, to issue an alert, and causing at least one of: a first indication associated with the alert to be output via the one or more lighting elements, or a second indication associated with the alert to be output via the one or more speakers.

B: The device of paragraph A, wherein the one or more lighting elements are configured to output the first indication via a first side of the housing, and wherein the device further comprises: a battery disposed within the housing; and a charging port located on a second side of the housing.

C: The device of paragraph A or B, further comprising one or more fastening mechanisms, the one or more fastening mechanisms being at least partially disposed over a first side of the housing that is opposite a second side of the housing in which the first indication is output.

D: The device of any of paragraphs A-C, wherein the one or more fastening mechanisms are configured to secure the device to a bill of a hardhat.

E: The device of any of paragraphs A-D, further comprising one or more network interfaces, and the operations further including sending, via the one or more network interfaces, a third indication to an additional device associated with the alert.

F: The device of any of paragraphs A-E, the operations further including receiving additional data associated with at least one of: first settings for the at least one of the voltage detector or the current detector; second settings for the first indication output via the one or more lighting elements; or third settings for the second indication output via the one or more speakers.

G: The device of any of paragraphs A-F, wherein at least one of the first indication or the second indication is indicative of at least one of: a directionality of a detected voltage or a current; or an intensity of the detected voltage or the current.

H: The device of any of paragraphs A-G, further comprising a button associated with controlling one or more settings of the device.

I: A device, comprising: a housing including: a first side, a second side opposite the first side, and a third side located between the first side and the second side; a first fastening mechanism including: a first portion extending from at least one of the second side or the third side, and a second portion extending transversely from the first portion and being disposed at least partially over the second side; a second fastening mechanism including: a third portion extending from the at least one of the second side or the third side, and a fourth portion extending transversely from the third portion and being disposed at least partially over the second side; one or more sensors disposed within the housing and configured to generate sensor data indicative of at least one of a voltage or current detected in proximity to the device; and one or more lighting elements disposed within the housing and configured to output light in a direction towards the first side, the light being indicative of the at least one of the voltage or the current detected in proximity to the device.

J: The device of paragraph I, further comprising one or more speakers disposed within the housing, wherein the one or more speakers are configured to output audio indicative of the at least one of the voltage or the current detected in proximity to the device.

K: The device of paragraph I or J, wherein: the light output by the one or more lighting elements is indicative of at least one of: a directionality of the at least one of the voltage or the current, or an intensity of the at least one of the voltage or the current; and the audio output by the one or more speakers is indicative of at least one of: the directionality of the at least one of the voltage or the current, or the intensity of the at least one of the voltage or the current.

L: The device of any of paragraphs I-K, further comprising one or more ribs disposed on the second side of the housing.

M: The device of any of paragraphs I-L, further comprising one or more network interfaces that are configured to communicatively couple the device to one or more additional devices.

N: The device of any of paragraphs I-M, wherein the device is configured to: receive, via the one or more network interfaces, first data associated with the light to be output by the one or more lighting elements responsive to the at least one of the voltage or the current detected in proximity to the device; and transmit, via the one or more network interfaces, second data associated with: the sensor data, or an indication of the at least one of the voltage or the current detected in proximity to the device.

O: The device of any of paragraphs I-N, wherein: the first fastening mechanism and the second fastening mechanism are configured to secure the device to a hardhat; when secured to the hardhat, a bill of the hardhat is interposed between the second portion of the first fastening mechanism and the second side of the housing; and when secured to the hardhat, the bill of the hardhat is interposed between the fourth portion of the second fastening mechanism and the second side of the housing.

P: A device, comprising: a housing; one or more sensors configured to detect at least one of a voltage or a current in proximity to the device; one or more lighting elements configured to output light responsive to the one or more sensors detecting the at least one of the voltage or the current in proximity to the device; one or more speakers configured to output audio responsive to the one or more sensors detecting the at least one of the voltage or the current in proximity to the device; one or more network interfaces configured to communicatively couple the device to one or more additional devices; and one or more fastening mechanisms configured to secure the device to a surface.

Q: The device of paragraph P, wherein at least one of: the light output by the one or more lighting elements is indicative of at least one of: a directionality of the at least one of the voltage or the current, or an intensity of the at least one of the voltage or the current; and the audio output by the one or more speakers is indicative of at least one of: the directionality of the at least one of the voltage or the current, or the intensity of the at least one of the voltage or the current.

R: The device of paragraph P or Q, wherein: the housing includes: a first side, and a second side that is opposite the second side; the light output by the one or more lighting elements is output at least partially on the first side; at least a portion of the one or more fastening mechanisms is disposed over the second side; and the surface is secured between the second side and the at least the portion of the one or more fastening mechanisms.

S: The device of any of paragraphs P-R, wherein: the housing further includes: a third side extending between the first side and the second side, a fourth side, and a fifth side opposite the fourth side; and the third side curves between the fourth side and the fifth side.

T: The device of any of paragraphs P-S, wherein the one or more fastening mechanisms include clips that are biasable.

CONCLUSION

Although several embodiments have been described in language specific to structural features and/or methodological acts, it is to be understood that the claims are not necessarily limited to the specific features or acts described. Rather, the specific features and acts are disclosed as illustrative forms of implementing the claimed subject matter.

What is claimed is:

1. A device, comprising:
   a housing;
   one or more lighting elements disposed within the housing;
   one or more speakers disposed within the housing;
   at least one of a voltage detector or a current detector disposed within the housing;
   one or more processors; and
   one or more computer-readable media storing instructions that, when executed, cause the one or more processors to perform operations including:
      determining, at a first instance, a threshold associated with issuing alerts;
      receiving first data associated with a sensitivity adjustment to the threshold when issuing the alerts;
      determining, at a second instance that is after the first instance and based at least in part on the first data, an updated threshold associated with issuing the alerts, the updated threshold being different than the threshold;
      receiving second data from the at least one of the voltage detector or the current detector;
      determining, based at least in part on the second data, at least one of a voltage or a current within an environment;
      determining that the at least one of the voltage or the current satisfies the updated threshold;
      determining, based at least in part on the at least one of the voltage or the current satisfying the updated threshold, to issue an alert, and
      causing at least one of:
         a first indication associated with the alert to be output via the one or more lighting elements, or
         a second indication associated with the alert to be output via the one or more speakers.

2. The device of claim 1, wherein the one or more lighting elements are configured to output the first indication via a first side of the housing, and
   wherein the device further comprises:
      a battery disposed within the housing; and
      a charging port located on a second side of the housing.

3. The device of claim 1, further comprising one or more wireless network interfaces, and the operations further including sending, via the one or more wireless network interfaces, third data to an additional device associated with the alert.

4. The device of claim 1, wherein the first data is further associated with at least one of:
   first settings for the first indication output via the one or more lighting elements; or
   second settings for the second indication output via the one or more speakers.

5. The device of claim 1, wherein at least one of the first indication or the second indication is indicative of at least one of:
   a directionality of the at least one of the voltage or the current; or
   an intensity of the at least one of the voltage or the current.

6. The device of claim 1, further comprising a button associated with controlling one or more settings of the device.

7. The device of claim 1, wherein the updated threshold is a first updated threshold, the operations further including:
   receiving third data associated with a second sensitivity adjustment when issuing the alerts;

determining, at a third instance that is after the second instance and based at least in part on the third data, a second updated threshold that is different than the first updated threshold;

receiving fourth data from the at least one of the voltage detector or the current detector;

determining, based at least in part on the fourth data, at least one of a second current or a second voltage within the environment;

determining that the at least one of the second voltage or the second current satisfies the second updated threshold; and determining, based at least in part on the at least one of the second voltage or the second current satisfying the second updated threshold, to issue a second alert.

8. The device of claim 1, wherein the first data is received via one or more inputs to a button of the device or a second device communicatively coupled to the device.

9. A device, comprising:
a housing including:
a first side,
a second side opposite the first side,
a third side located between the first side and the second side, and
a fourth side opposite the third side;
a first fastening clip including:
a first portion extending from at least one of the second side or the third side, and
a second portion extending from the first portion in a direction towards the fourth side, the second portion being biased towards the second side;
a second fastening clip including:
a third portion extending from the at least one of the second side or the third side, and
a fourth portion extending from the third portion and being disposed in the direction towards the fourth side, the fourth portion being biased towards the second side;
one or more buttons disposed on the first side;
one or more sensors disposed within the housing and configured to generate sensor data indicative of at least one of a voltage or a current detected in proximity to the device; and
one or more lighting elements disposed within the housing and configured to output light in a direction towards the first side, the light being indicative of the at least one of the voltage or the current detected in proximity to the device.

10. The device of claim 9, further comprising one or more speakers disposed within the housing, wherein the one or more speakers are configured to output audio indicative of the at least one of the voltage or the current detected in proximity to the device.

11. The device of claim 10, wherein:
the light output by the one or more lighting elements is indicative of at least one of:
a directionality of the at least one of the voltage or the current, or
an intensity of the at least one of the voltage or the current; and
the audio output by the one or more speakers is indicative of at least one of:
the directionality of the at least one of the voltage or the current, or
the intensity of the at least one of the voltage or the current.

12. The device of claim 9, further comprising one or more wireless network interfaces that are configured to communicatively couple the device to one or more additional devices.

13. The device of claim 12, wherein the device is configured to:
receive, via the one or more wireless network interfaces, first data associated with the light to be output by the one or more lighting elements responsive to the at least one of the voltage or the current detected in proximity to the device; and
transmit, via the one or more wireless network interfaces, second data associated with:
the sensor data, or
an indication of the at least one of the voltage or the current detected in proximity to the device.

14. The device of claim 9, wherein:
the first fastening clip and the second fastening clip are configured to secure the device to a hardhat;
when secured to the hardhat, a bill of the hardhat is interposed between the second portion of the first fastening clip and the second side of the housing; and
when secured to the hardhat, the bill of the hardhat is interposed between the fourth portion of the second fastening clip and the second side of the housing.

15. The device of claim 9, wherein the first fastening clip and the second fastening clip are configured to secure the device to at least one of:
an article of clothing,
a belt, or
a piece of equipment.

16. A wearable device configured to couple to a hardhat worn by a user, comprising:
a housing;
one or more sensors configured to detect at least one of a voltage or a current in proximity to the wearable device;
one or more lighting elements configured to output light responsive to the one or more sensors detecting the at least one of the voltage or the current in proximity to the wearable device;
one or more wireless network interfaces configured to communicatively couple the wearable device to one or more additional devices;
an accelerometer configured to generate data indicative of accelerations associated with the hardhat;
a button configured to adjust a setting of the one or more sensors to detect the at least one of the voltage or the current;
one or more processors; and
one or more computer-readable media storing instructions that, when executed, cause the one or more processors to perform operations including:
determining at least one of:
a directionality of the at least one of the voltage or the current, or
an intensity of the at least one of the voltage or the current, and
causing, via the one or more lighting elements, output of light that indicates the at least one of the directionality or the intensity.

17. The wearable device of claim 16, further comprising one or more speakers configured to output audio responsive to the one or more sensors detecting the at least one of the voltage or the current in proximity to the wearable device, wherein the audio output by the one or more speakers is indicative of at least one of:

the directionality of the at least one of the voltage or the current, or the intensity of the at least one of the voltage or the current.

18. The wearable device of claim 16, further comprising one or more fastening mechanisms configured to secure the wearable device to the hardhat, wherein:
   the housing includes:
      a first side, and
      a second side that is opposite the first side;
   the light output by the one or more lighting elements is output at least partially on the first side;
   at least a portion of the one or more fastening mechanism is disposed over the second side; and
   the hardhat is secured between the second side and the at least the portion of the one or more fastening mechanism.

19. The wearable device of claim 16, further comprising one or more fastening mechanisms configured to secure the wearable device to the hardhat, wherein the one or more fastening mechanism include clips that are biasable.

20. The wearable device of claim 16, wherein,
   the housing includes:
      a first side,
      a second side, and
      a third side opposite the second side; and
   the one or more lighting elements output the light at least partially on the first side, the one or more lighting elements being located more proximate to the second side than the third side.

* * * * *